United States Patent [19]

Yamamoto et al.

[11] Patent Number: 5,585,904
[45] Date of Patent: Dec. 17, 1996

[54] DRUM TYPE IMAGE TRANSFER APPARATUS

[75] Inventors: Toshiyuki Yamamoto; Junichi Tamura; Katsushi Fujita; Masato Doi, all of Hino, Japan

[73] Assignee: Konica Corporation, Japan

[21] Appl. No.: 552,463

[22] Filed: Nov. 9, 1995

[30]     Foreign Application Priority Data

Nov. 18, 1994   [JP]   Japan .................................. 6-285293

[51] Int. Cl.$^6$ .................................................. B41F 16/00
[52] U.S. Cl. ......................... 355/271; 101/492; 156/277; 355/277; 355/279
[58] Field of Search .................................. 355/271, 278, 355/277, 279, 280, 47, 127; 101/487, 488, 492; 156/230, 240, 277; 347/213

[56]                References Cited

U.S. PATENT DOCUMENTS

| | | | |
|---|---|---|---|
| 4,992,833 | 2/1991 | Dermiggio | 355/271 X |
| 5,155,536 | 10/1992 | Johnson et al. | 355/290 |
| 5,339,148 | 8/1994 | Johnson et al. | 355/277 X |
| 5,400,126 | 3/1995 | Cahill et al. | 355/278 |
| 5,414,502 | 5/1995 | Cahill et al. | 355/278 |
| 5,428,430 | 6/1995 | Aslam et al. | 355/271 X |

*Primary Examiner*—Matthew S. Smith
*Attorney, Agent, or Firm*—Jordan B. Bierman; Bierman and Muserlian

[57]                ABSTRACT

A transfer drum of an image forming apparatus has a setting section at which an image receiving material is set on the transfer drum and an image forming material bearing an image is superimposed on the image receiving material. The image forming apparatus further includes a cooling device for cooling the setting section of the transfer drum.

28 Claims, 25 Drawing Sheets

DRUM TYPE IMAGE TRANSFER APPARATUS

BACKGROUND OF THE INVENTION

The present invention relates to the image formation system wherein the image receiving material is placed on the transfer drum, and the image forming material already subjected to development is placed opposite to said image receiving material to be pressurized and heated, thereby transferring the image of the image forming material onto the image receiving material.

According to the prior art in the field of printing plates, three-color or four-color dot film, for example, has been produced by color separation of the continuous tone image of the photographic original (e.g. negative film, reversal color film paper). This film is used to manufacture the printing plate such as PS plate. This method according to the prior art requires a great amount of film for color separation and image composition before producing printing plates. Such a complicated work process is accompanied by many errors including character and layout errors. Furthermore, it is necessary to provide some means for immediate response to the customer's requirements for changes in specifications. It is also necessary to make prior inspection to see if the printed matter can be finished to the required color tone, gradation and layout. Manufacture of a formal printing plate for this confirmation has required the process of trail proof called proof printing, as well as use of many other systems.

Images are produced, for example, by the dot film, CRT, silver salt such colored photosensitized material, non-silver salt based photosensitized material such as diazo compound, photoelectric system or image formation by dry toner, thereby estimating the quality of the completed printed matter. However, these proofing systems have generally required a long time to produce one proof sheet, involving such problems as large system size, expensive material costs and poor workability. These prior art systems have failed to meet all requirements for practical use.

In an effort to solve these problems, a proof system utilizing the photopolymer photosensitized material has been used in recent years to get proof sheets. This method uses the same pigment as the printing ink for color image, making it possible to produce multi-colored image considerably similar to the printed matter.

To make such a proof sheet, the image is exposed by the image exposure device by placing a color photosensitized sheet for Y, M, C and BK on top of the positive film corresponding to each color; then it is developed by a development device, thereby gaining the image forming material of various colors. After that, the image receiving material is placed on top of the first color image forming material by a transfer device, and is pressurized, heated and transferred, thereby transferring the image on the image receiving material. These operations are repeated four times for each image receiving material to get the multi-colored image.

When the colored proof sheet is prepared, the image forming material of each color is obtained by development of the image forming material having a colored photosensitized layer on the supporter after image exposure for example. Then the image receiving material is placed on the rotating transfer drum, and the developed image forming material is placed opposite to this image receiving material. It is pressurized and heated, thereby transferring the image of the image forming material onto the image receiving material.

The image forming material is set on the pin bar by the transfer drum setter, and is placed on the image receiving material. Since the rise in setter temperature makes it difficult for the user to set it, the user has to turn off the heat source and to wait for it to be cooled, according to the prior art method.

Just turning off the heat source and waiting for cooling require much time. Even of a cooling fan is used, the following problem occurs when the operation has been continued at a specified amount of air since power was turned on: Namely, much heat is dissipated only around the transfer drum setter, and only the setter temperature is lower by several degrees Celsius, even if the entire transfer drum temperature has reached the set value. Tens of minutes must be wasted to raise the setter temperature to the set value, while maintaining the temperature of other parts constant. Furthermore, if temperature is adjusted without stopping the transfer drum, for example, reduction in temperature of the setter alone may be prevented, but longer time is required for the entire transfer drum temperature to reach the set value.

Use of a cooling fan as the cooling means signifies blowing of cooling air into the setter for cooling. This will result in fluttering of the tip end where the image forming material is set on the pin bar, and setting difficulties will arise.

Furthermore, after the image forming material has been on the transfer drum setter, the pressure roller is moved while the rotating drum is turned, so that the image forming material is placed opposite to the image receiving material. Then pressurized and heat are given to transfer the image of the image forming material to the image receiving material. In order to prevent the pressure roller from contacting the setter in this case, the pressurized position is moved away from the setter, resulting in reduction of the effective image area that much. This problem has been involved in the prior art method.

To improve the image receiving material retainability, an adhesive sheet, for example, has been used on the surface of the transfer drum. The image receiving material is placed on this adhesive sheet, but dust may attach onto the adhesive sheet by use, giving adverse effect to the flatness of the image receiving material. To prevent this, the adhesive sheet must be cleaned to remove dust. Cleaning the sheet requires special measures to be taken; e.g. it requires heating of the transfer drum to be suspended or partial rotation to be adopted.

The transfer work of the drum transfer device is done manually; this requires much time and labor as well as a high degree of skill in ensuring high accuracy. The following is one of the method of setting the transfer film which is a image forming material; after the final printing paper and transfer film are put together, they are set on the drum. The tip of the transfer film is fixed on the drum, and the end of the transfer film is manually lifted to remove creases. Furthermore, it has been known that such conventional methods involve such problems as uneven transfer by uneven roller pressure or heat, transfer error of the transfer from the drum and a burn in handling the pin bar.

The present invention is intended to solve at least one of these problems. The object of the drum type transfer device according to the present invention is to provide a means for ensuring improved image quality by elimination of uneven transfer, improved image quality by eliminating transfer displacement, improved safety by eliminating the danger of being burnt; the present invention is, furthermore, intended to ensure workability improvement and prevention of operation errors.

SUMMARY OF THE INVENTION

The above object can be achieved by the following constructions:

(1) A controllable cooling means is provided to cool the said transfer drum setter in an image forming apparatus wherein the image receiving material is held by the transfer drum, and the image forming material is placed opposite to said image receiving material, with pressure and heat being applied thereto by the pressing means to transfer said image of the image forming material onto said image receiving material.

(2) The image forming apparatus of the present invention comprises (i) a transfer temperature detecting means to detect the said drum transfer temperature, (ii) a pressing temperature detecting means to detect pressing temperature of said pressure means, and (iii) a controlling means to control said cooling means, based on the temperature information provided by said transfer temperature detecting means or said pressure temperature detecting means. When the temperature adjustment is started after power is turned on, said control means suspends the operation of said cooling means until said transfer temperature or pressing temperature reaches a specified value, and resumes the operation of said cooling means when specified temperature has been reached.

(3) An image forming apparatus, wherein the image receiving material is placed on the transfer drum and the image forming material is placed opposite to said image receiving material, with pressure and heat being applied thereto by the pressing means to transfer said image of the image forming material onto said image receiving material, comprises: (i) a cooling fan to cool the transfer drum setter (setting section) which sets said image forming material; (ii) a setting work status detecting means to detect how said image forming material is being set; and (iii) a control means for controlling said fan according to detection by the said setting work status detecting means. Said control means suspends or reduces the output of said fan according to detection by the said setting work status detecting means, and releases the control of suspension and reduction of said cooling fan output on completion of this setting work detection or after the lapse of a specified time.

(4) An image forming apparatus, wherein the image receiving material is placed on the transfer drum and the image forming material is placed opposite to said image receiving material, with pressure and heat being applied thereto by the pressing means to transfer said image of the image forming material onto said image receiving material, comprises: (i) a transfer drum drive means for rotating said transfer drum; (ii) a drum position detecting means for detecting the rotational position of said transfer drum; (iii) a pressure drive means to press said pressing means against said transfer drum; and (iv) a control means for controlling said pressure drive means by detecting the rotational position of said transfer drum. Said control means provides controls in such a way that the rotational position of said transfer drum is detected to control transfer drum drive means and to stops said transfer drum at a specified position. The pressure drive means is controlled to give pressure by pressing means to resume rotation of said transfer drum, thereby executing the transfer process.

(5) An image forming apparatus, wherein the image receiving material is placed on the transfer drum and the image forming material is placed opposite to said image receiving material, with pressure and heat being applied thereto by the pressing means to transfer said image of the image forming material onto said image receiving material, comprises: (i) a transfer drum heating stop detecting means to detect stopping of the heating means of said transfer drum; (ii) a drum rotation switch to drive said transfer drum; and (iii) a control means to drive said transfer drum by the operation of said drum rotation switch, with said heating means stopped. Said control means drives said drum rotation switch only when said drum rotation switch is being pressed.

(6) A transfer drum detecting means to detect said transfer drum temperature is provided. When the transfer drum temperature has reduced below the specified value, said control means provides controls in such a way that the transfer drum is driven only when the drum rotation switch is being pressed.

(7) The surface of the transfer drum is provided with a member whose color is changed when the transfer drum temperature has reached a specified value.

(8) A transfer drum detecting means to detect said transfer drum temperature is provided. When the transfer drum temperature has reduced below the specified value, said control means provides controls in such a way that the separation guide to separate said image forming material laid out around the transfer drum can be moved in a direction of separating from the setter, and that it will stop at a position close to said setter when the transfer drum temperature is over a specified value.

(9) A drum type transfer device, wherein transfer is performed by the drum covered with an adhesive sheet, is provided with (i) a drum covered with said adhesive sheet, (ii) a top end securing means for securing the top end of the adhesive sheet to said drum, (iii) a rear end securing means for securing the rear end of the adhesive sheet to said drum, and (iv) a sag removing means to remove sags at the top and rears end of the adhesive sheet to said drum.

(10) In a drum type transfer device wherein sheets including the final printing paper (the image receiving material) and transfer film (the image forming material) are secured on the heated drum means and are driven for transfer works, at least a portion of the surface has a heat insulator, and said drum means is provided with a sheet securing means for securing said sheets including the final printing paper and transfer film onto the heated drum means. Said sheet securing means is a pin bar material to position the top end of the transfer film and/or a separation material to separate the transfer film, and said sheet securing means has a final printing paper register unit.

(11) In a drum type transfer device, wherein transfer work is performed by the transfer film with the final printing paper wound and secured on the drum, said drum is provided with an optical detecting means to provide optical detection of presence/absence of said final printing paper and/or at least the longitudinal length of said final printing paper. Said optical detecting means has a light emitting portion and light receiving portion to provide transparent and/or reflective type optical detection.

(12) A drum type transfer device, wherein the top end of the transfer film is secured to the drum and is pressurized by a pressure roller, comprises: (i) a drum means to secure said transfer film; (ii) a pressure roller means to give pressure so that the central portion will have the minimum pressure in the longitudinal direction of the pressure roller; and (iii) a pressure means to press said pressure roller against the transfer film. The said drum means has a heating means. The surface of the pressure roller of said pressure roller means is an elastic body having a Vickers hardness of 30 to 89 degrees. Said drum means has the surface provided with a bed pace having a thickness of 75 to 175 µm and a silicon layer adhesive sheet having a thickness of 75 to 175 µm.

(13) A drum type transfer device, wherein the top end of the transfer film is secured to the drum and is pressurized for transfer work, has a drum means which sets the transfer film at the first position, gives tension at the second position by the dead weight of the transfer film, and give pressure to the transfer film at the third position.

(14) A drum type transfer device, wherein the top end of the transfer film is secured to the drum and is pressurized for transfer work, comprises: (i) a drum to secure the top end of the transfer film; (ii) a pressure roller to give pressure to the transfer film; (iii) a pressure roller drive means to drive said pressure roller along the outer periphery of the drum; and (iv) a pressing means to press said pressure roller against the drum.

(15) A drum type transfer device, wherein the top end of the transfer film is secured to the drum and is pressurized for transfer work, comprises; (i) a drum to secure the top end of said transfer drum; (ii) the transfer film top end securing member to secure the top end of the transfer film; and (iii) a lifting means to lift the transfer film close the drum.

(16) A drum type transfer device which uses a pin bar system to position the transfer film on the drum comprises: (i) a drum to secure the top end of said transfer drum; (ii) a pin member to give tension crosswise (in the direction of width) to the transfer film slidable on said drum; and (iii) an elastic member to energize the said pin member in parallel to the drum shaft.

The term "drum means" used herein is intended to signify a drum means where the final printing paper is wound and which secures the top end of the transfer film. The term "adhesive sheet" used herein is intended to signify an adhesive sheet used to facilitate securing of the final printing paper onto the drum. "Sheets" include an adhesive sheet, final printing paper and transfer film. Furthermore, the top end securing means is a means to secure the top end of the adhesive tape, whereas the rear end securing means is a means to secure the rear end of the adhesive tape. The term "sag removing means" used herein signifies a means to remove sags of the adhesive sheet. The term "heat insulator" refers to plastics and rubber materials which serve to prevent burn accidents.

The term "pin bar member" is a pin member by which the transfer film is positioned on the drum. Furthermore, "separation member" is a the member used to separate the transfer film. "Optical detecting means" is a means to detect the position, width and length of the final printing paper optically, and is provided with a transparent and/or reflective type the light emitting portion and light receiving portion.

According to the invention of CONSTRUCTION (1), the cooling means can be controlled, and impact on others can be reduced by cooling the setter whenever required, thereby facilitating recovery of temperature uniformity.

According to the invention of CONSTRUCTION (2), when the temperature adjustment is started after power is turned on, the operation of the cooling means is suspended until transfer temperature or the pressure temperature reaches a specified temperature. The cooling means is operated again when the temperature has reached the specified temperature, thereby ensuring uniform startup of temperature adjustment.

According to the invention of CONSTRUCTION (3), the output of said fan is suspended or reduced by detection of the image forming material setting condition, and the control of suspension and reduction of said cooling fan output is released on completion of this setting condition detection or after the lapse of a specified time, thereby preventing the top end from fluttering when the image forming material is set, resulting in great improvement in setting work efficiency.

According to the invention of CONSTRUCTION (4), the transfer drum is stopped at the specified position, pressure is applied when it is stopped, and the transfer drum is driven to perform transfer work. This allows the pressurized position to be brought close to the setter, increasing by that amount the effective area of the image to be transferred.

According to the invention of CONSTRUCTION (5), the transfer drum is driven only when the drum rotation switch is being pressed, thereby allowing easy removal of the dust particles sticking to the adhesive sheet and ensuring improved maintenance.

According to the invention of CONSTRUCTION (6), if the transfer drum temperature has reduced below the specified value, the transfer drum is driven only when said drum rotation switch is being pressed. This is to prevent the user from cleaning the transfer drum when temperature is high.

According to the invention of CONSTRUCTION (7), the surface of the transfer drum is provided with a member whose color is changed when the transfer drum temperature has reached a specified value. This permits the user to recognize by visual observation that the transfer drum has a high temperature, thereby preventing the user from cleaning the transfer drum when temperature is high.

According to the invention of CONSTRUCTION (8), when the transfer drum temperature has reduced below the specified value, the separation guide to separate the image forming material laid out around the transfer drum can be moved in a direction of separating from the setter, allowing the user to clean the device by moving the separation guide. When the transfer drum temperature is over a specified value, the separation guide is stopped at a position close to said setter. This prevents the user from touching the surface of the transfer drum by the separation guide, thereby preventing the user from cleaning the transfer drum when temperature is high.

DETAILED DESCRIPTION OF PREFERRED EMBODIMENTS

The following describes the image forming apparatus according to the present invention. The following description shows the color proof producing device as an image forming apparatus according to the present invention; however, it should not be understood that the present invention is limited only to these embodiments.

Figure 1:
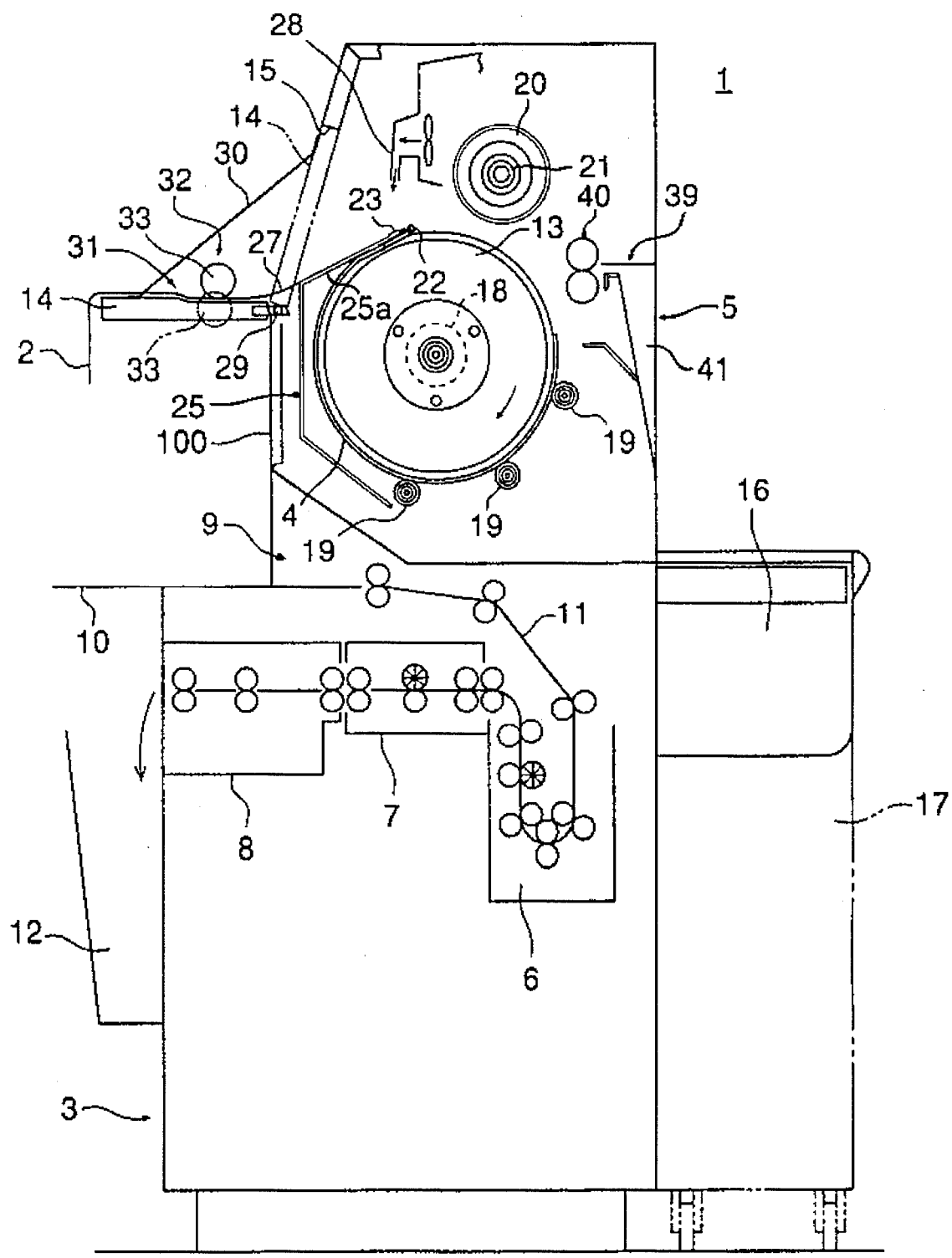
FIG. 1 is a side view in cross section of a color proof producing device.

FIG. 1 is a side view in cross section of a color proof producing device. The apparatus body 100 of the color proof producing device 1 is provided with a development processor 3 to develop the exposed image forming material 2, and a transfer unit 5 to transfer the image the image forming material 2 onto the image receiving material 4 by pressurizing and heating the image forming material 2 developed by the development processor 3 which is placed opposite to the image receiving material 4 including so-called original paper. This color proof producing device 1 has the development processor 3 on the lower part the transfer unit 5 on the upper part, integrated with each other, and is designed to allow independent and simultaneous development and transfer, respectively, on the development processor 3 and on the transfer unit 5. It is apparent that only the transfer unit 5 can be used, with the image forming material 2 manufactured by others.

The development processor 3 comprises the development unit 6 provided with transfer roller the water washing unit 7, and the drying unit 8. The image forming material 2 which has been exposed at a different place is inserted through a insertion tray 10 of a feeder 9 provided on the front of the system, and the image forming material 2 is fed to the development unit 6 via a transport route 11. It is fed from the development unit 6 to a water washing unit 7 and drying unit 8 where it is developed, rinsed, and dried. The image forming material 2 after being developed is put into a basket 12 provided on the front of the apparatus body 100. The water washing unit referred to herein may use very little or no water; it can be a no-water washing unit.

As described above, the image forming material 2 having an image for coloring in conformity to said image exposure is obtained after the already exposed image forming material 2 has been developed, washed and dried. At the transfer unit 5, this developed image forming material 2 is correctly positioned to the same image receiving material 4 on the transfer drum 13, and is pressurized and heated three times for Y, M and C, or four times with black (BK) included, thereby transferring the image of the image forming material 2 onto the image receiving material 4. This completes color proof generation.

The transfer unit 5 of the apparatus body 100 has a open/close cover 14, which is opened to set the image receiving material 4 and the image forming material 2 are through the opening 15, as well as to take out the image receiving material 4 already transferred.

A discharge means to discharge the image forming material 2 is provided on the back of the apparatus body 100, and a small collection box 16 or large collection box 17 can be installed easily outside. After image transfer, the image forming material 2 is dropped into the small collection box 16 or large collection box 17 to be collected therein.

Figure 2:
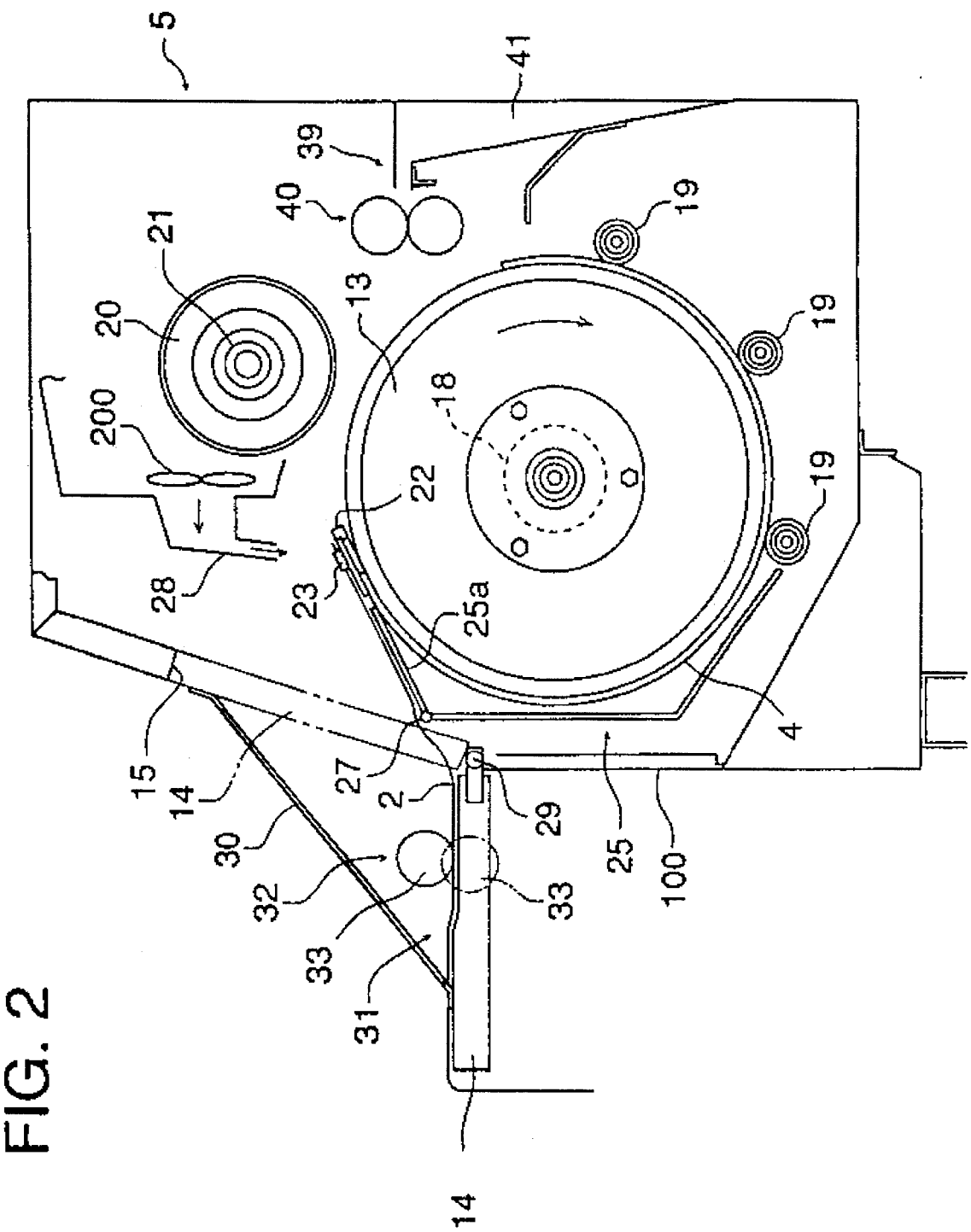
FIG. 2 is a side view in cross section of a image forming material being set.
Figure 3:
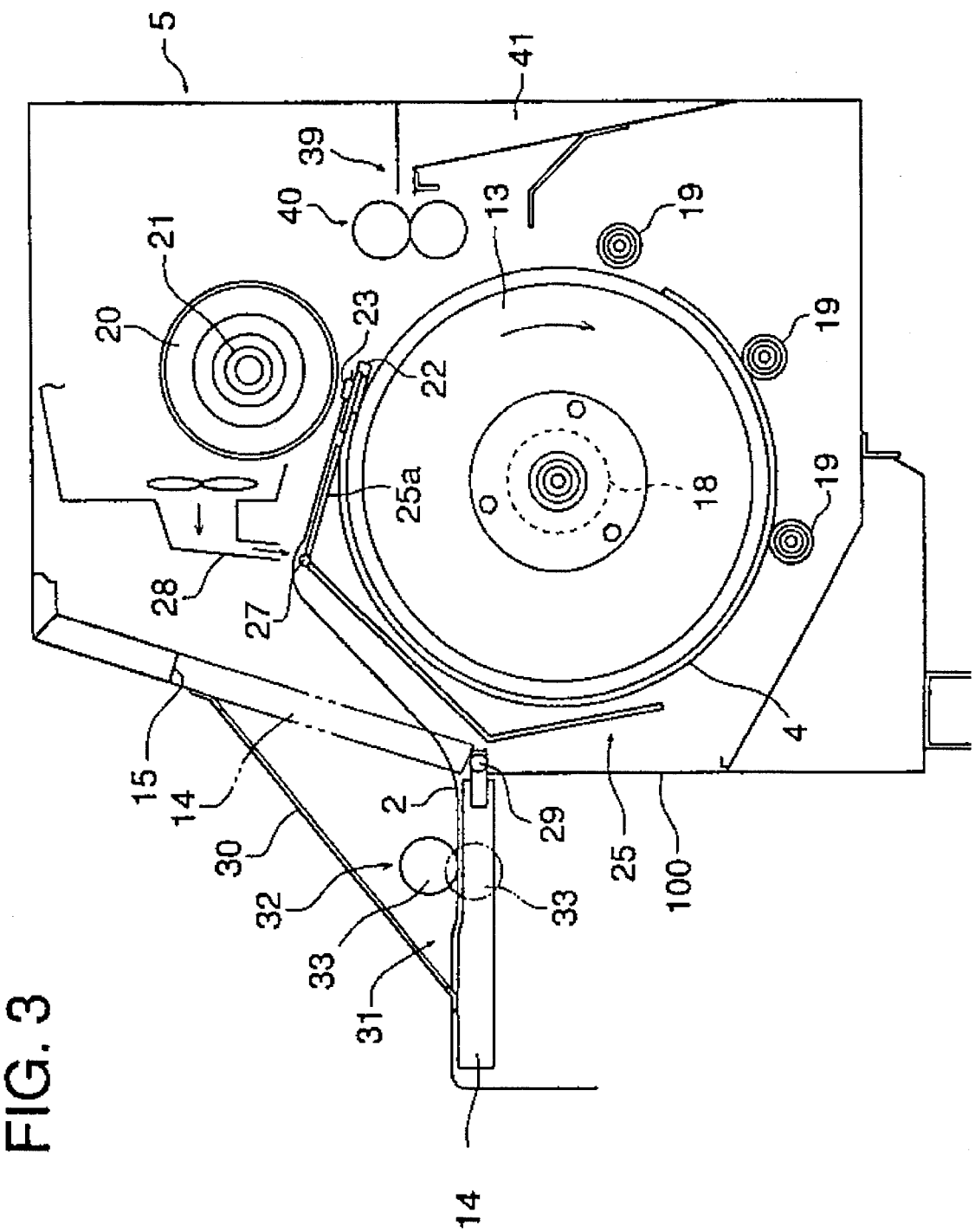
FIG. 3 is a side view in cross section of a transfer drum having started transfer operation.
Figure 4:
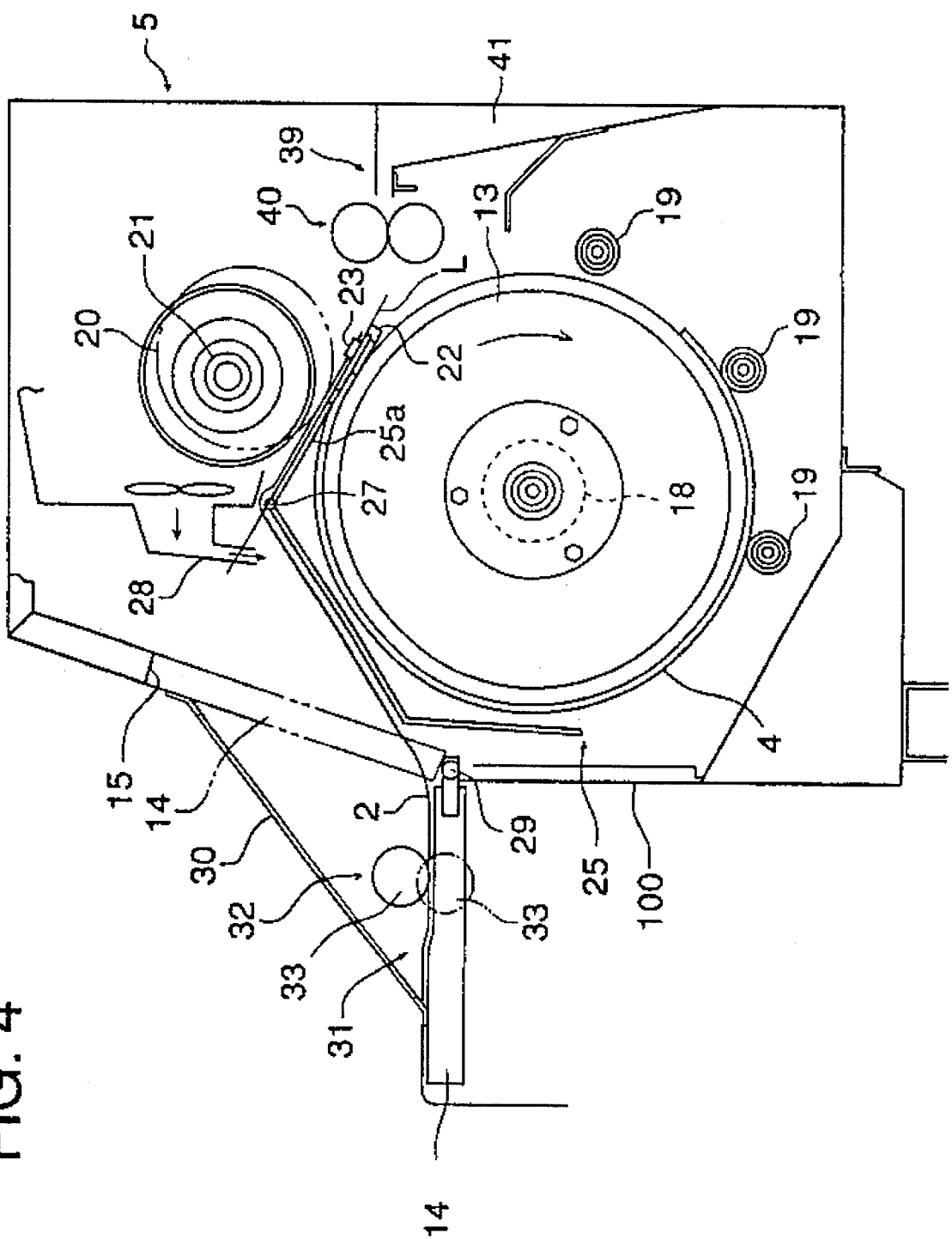
FIG. 4 is a side view in cross section of a pressure roller applying pressure.
Figure 5:
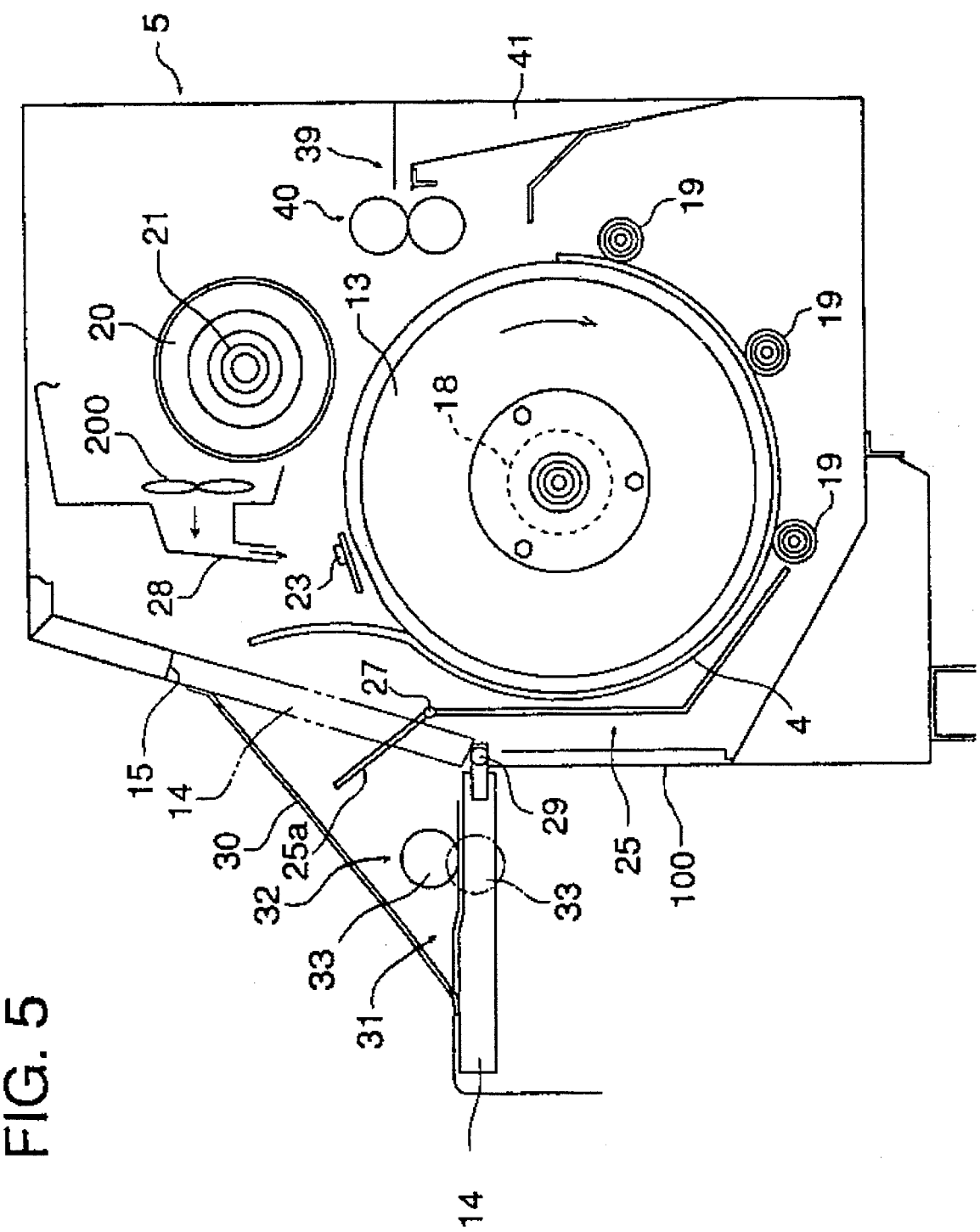
FIG. 5 is a side view of an image receiving material being taken out.

The following describes the details of the transfer unit 5 with reference to FIGS. 2 to 5. FIG. 2 is a side view in cross section of a image forming material being set; FIG. 3 is a side view in cross section of a transfer drum having started transfer operation; FIG. 4 is a side view in cross section of a pressure roller applying pressure; and FIG. 5 is a side view of an image receiving material being taken out.

The transfer drum 13 is installed on the transfer unit 5 so that it can be driven in the arrow direction. The shaft center of the transfer drum 13 is provided with a heater 18, and the heater 18 can be easily controlled to ensure the entire drum will have a uniform temperature. The transfer drum 13 has a resin base including PET on a cylindrical drum made of aluminum or stainless steel, and the resin base is further covered with heat resistant resin such as silicon rubber. An adhesive sheet is placed on the surface, and the image receiving material 4 is held by the adhesive sheet.

Retainer rollers 19 are installed at specified intervals on the lower side of the transfer drum 13. A pressure roller 20 constituting a pressing means is provided on the upper side of the transfer drum 13. A heater 21 is installed on the shaft center of the pressure roller 20, which gives pressure to the transfer drum 13 having a uniform temperature and can be heated up to the temperature required for transfer. According to the present embodiment, the retainer roller 19 is coated with silicon rubber on the circumference, and the pressure roller 20 is provided with silicon rubber on its circumference.

The image receiving material 4 is first positioned to the specified position on the circumference of the transfer drum 13. The elastic body such as silicon rubber is formed crosswise (in the direction of width) on the transfer drum 13 where the top end of the image receiving material 4 is placed. After the top end of the image receiving material 4 has been mounted on said elastic body (not illustrated), the retainer plate 22 is pressed against the image receiving material 4 by the elastic force of the spring or the like (not illustrated). The lower side of the retainer plate 22 is provided with another elastic body to hold the image receiving material 4 between it and the one mentioned above. A pin bar 23 is formed on the top side, said pin bar having a resist pin which is used to ensure high precision register of the image forming material 2, to place the image forming material 2 opposite to the image receiving material 4, and to putting them together, one on top of the other.

The image receiving material 4 is wound on the transfer drum 13 while the transfer drum 13 is driven in the arrow direction (at the speed of 5 seconds to 1 minute to make one round; image transfer speed or a little higher speed may be used).

The image receiving material 4 is carried by the transfer drum 13. The image receiving material 4 is set on the retainer plate 22 and the image forming material 2 is placed on top of it opposite with each other. Then the image forming material 2 and image receiving material 4 placed on the transfer drum 13 are pressurized and heated by the pressure roller 20.

The transfer drum 13 has a retainer plate 22 to retain the top end of the image receiving material 4, and the pin bar 23 is provided on the retainer plate 22. The pin bar 23 is engaged with the top end of the image forming material 2 to place the image forming material 2 on top of the image receiving material 4. The transfer drum 13 can be driven and stopped in the arrow marked direction, and is designed not be make reverse rotation. The transfer drum 13 is controlled to ensure that the pin bar 23 provided on the outer cylindrical side of the transfer drum 13 at the position where the image forming material 2 is filled.

A separation guide 25 is installed on the circumference of the transfer drum 13. As illustrated in FIG. 2, it is located on the circumference of the transfer drum 13 and on the upstream side with respect to the pressure roller 20 in the direction of the transfer drum rotation. The separation guide 25 turns in the clockwise direction in the Figure along the circumference of the transfer drum 13 almost at the peripheral speed of the transfer drum 13. It stops when the top end of the separation guide 25 comes close to the position where pressure is applied. It is designed to separate the image forming material 2 from the transfer drum side and to lead it to the position where pressure is applied by the pressure roller 20.

The separation guide 25 has a guide plane portion 25a formed to insert the image forming material 2 in the direction of a tangent line between the transfer drum 13 and the pressure roller 20, and the guide plane portion 25a is designed to rotate to the outside using a shaft 27 as a fulcrum, as illustrated in FIG. 5. The guide plane portion 25a is located on the side of pin bar 23 when the image receiving material 4 and the image forming material 2 are set, as illustrated in FIGS. 2 to 4. It can be opened outside to take out the image receiving material 4 when the image receiving material 4 is taken out after transfer, as illustrated in FIG. 5.

As shown in FIG. 2, it allows the top end of the image forming material 2 to be engaged with the pin bar 23, opposite to the image receiving material 4 held by the transfer drum 13, to rotate with the transfer drum 13 in the arrow marked direction, as shown in FIG. 3. In this case, the image forming material 2 is separated from the transfer drum side by the separation guide 25 which moves along the circumference of the transfer drum 13, and is led to the position where pressure is applied by the pressure roller 20. At the position where pressure is applied by the pressure roller 20, as illustrated in FIG. 4, the guide plane portion 25a of the separation guide 25 corresponds to the tangent line L between the transfer drum 13 and the pressure roller 20 to insert the image forming material 2. The image forming material 2 is separated from the transfer drum side by the separation guide 25 and is free, until it is placed on top of the image receiving material 4 by the pressure roller 20.

Moreover, when the image forming material 2 is placed on top of the image receiving material 4 by the pressure roller 20, the pressure roller 20 is lowered to the side of the transfer drum 13, as illustrated in FIG. 4, resulting in the separation guide 25 being fixed along the tangent line L between the transfer drum 13 and the pressure roller 20. Under this condition, the transfer drum 13 rotates, thereby inserting the image forming material 2 in the direction of tangent line L. When the image forming material 2 is set, the image forming material 2 is set in a straight line from the pin bar 23 by the guide plane portion 25a of the separation guide 25. In this way, the rotation of the transfer drum 13 results in movement of the separation guide 25; thus, the separation guide 25 moves to the position where the image forming material 2 can be horizontally inserted between the pressure roller 20 and transfer drum 13, thereby minimizing the possibility of creases, deflection or register error occurring to the image forming material 2. To prevent the image forming material 2 from being damaged, the outside of the separation guide 25 is covered with Teflon, or damage preventive material is formed thereon.

The front stage of the pressure roller 20 is provided with a cooling air nozzle 28 as a cooling means, which sends cold air toward the transfer drum to squeezes the image forming material 2 separated by the separation guide 25, thereby minimizing the possibility of creases, deflection or register error occurring to the image forming material 2.

When a cooling fan is used as a cooling means, cooling air (not illustrated) may be led from the side (on the front or back side in FIG. 1) or back side (on the right side of FIG. 1).

In the present embodiment, the open/close cover 14 covering the opening 15 is provided to open toward the outside, using as fulcrum the shaft 29 parallel to the axial direction of the transfer drum 13. The open/close cover 14 is supported by the stopper means 30 so that the back side will face upward when it is opened. It constitutes a holding guide 31 which holds the image forming material 2 to be placed on top of the image receiving material 4 by the back of the open/close cover 14. The open/close cover 14 is coated with Teflon to prevent it from being damaged even when it contacts the image forming material 2. In this way, the back of the open/close cover 14 prevents the image forming material 2 from hanging down when the image forming material 2 is set, thereby minimizing the possibility of creases, deflection or register error occurring to the position close to the pin bar 23. Moreover, the back of the open/close cover 14 prevents the image forming material 2 from hanging down, and it is easy to provide a layout space since the open/close cover 14 serves also as a holding guide 31; it is also possible to provide a more compact configuration of the system. The open/close cover 14 requires an opening to install the image receiving material 4 and image forming material 2; this opening is already provided. This opening need not be of a rotary type; it may be of sliding type or other types.

The angle at which the open/close cover 14 is held by the stopper means 30 need not be specified; it can be held at the position indicated by the two-dot chain line. However, the open/close cover 14 is preferred to be held at an angle where no creases, deflection or register error will occur to the position close to the pin bar 23, when the image forming material 2 is set.

The back of the open/close cover 14 is provided with a pulling means 32. A pair of nipple rollers 33 of the pulling means 32 holds the image forming material 2, and tensile load is applied to the image forming material 2 by the rotation of the transfer drum 13.

The back stage from the pressure roller 20 is provided with a discharge means 39 which discharges into the small collection box 16 or large collection box 17 after transfer work the image forming material 2 separated from the image receiving material 4. The discharge means 39 comprises a discharge roller 40 and a discharge route 41. The top end of the image forming material 2 is removed from the pin bar 23 and is led into a pair of discharge rollers 40. The image forming material 2 transported by the rotation of the transfer drum 54 is separated from the face of the image receiving material 4 and is discharged through the discharge route 41 by a pair of discharge rollers 40.

Figure 6:
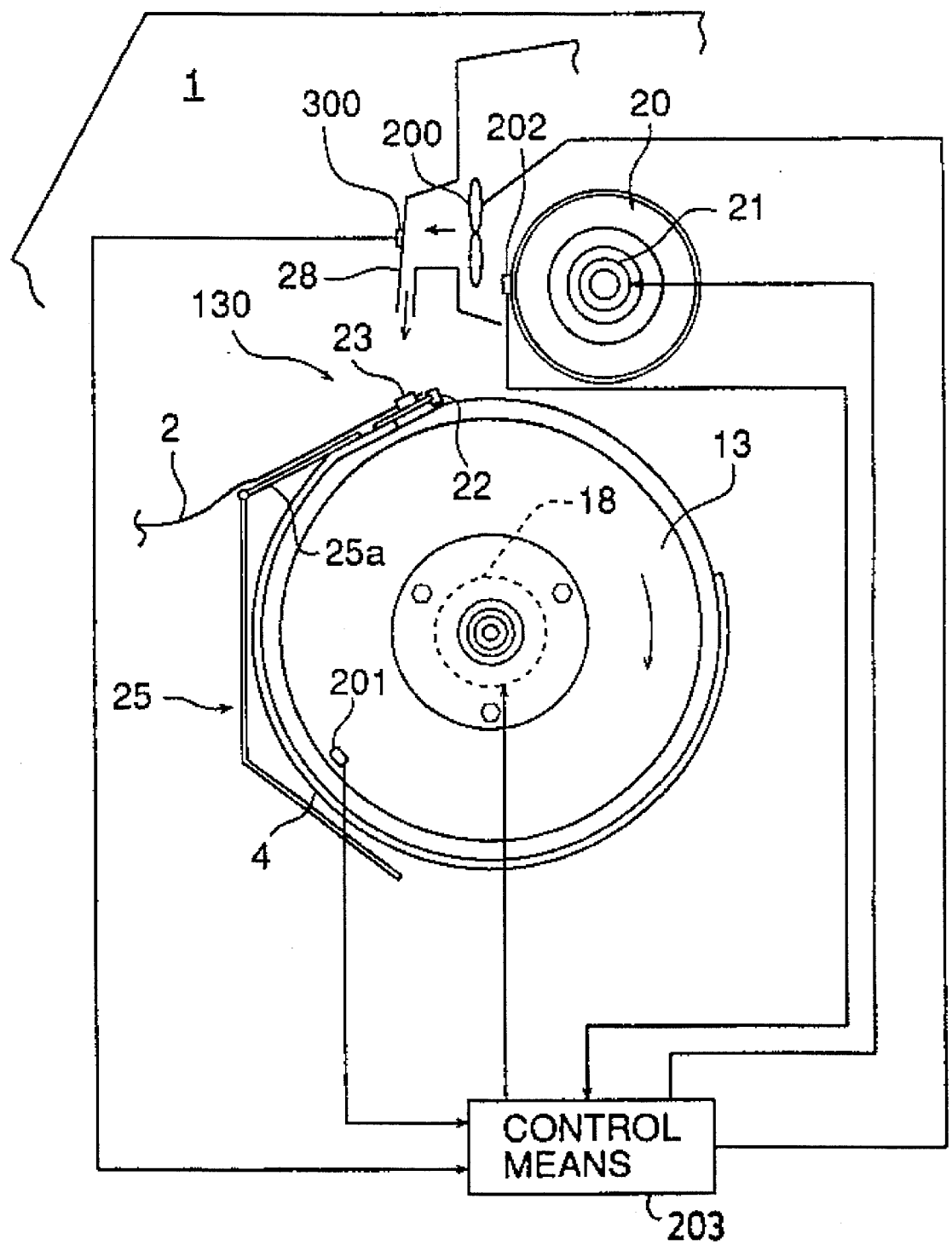
FIG. 6 is a drawing representing schematic configuration of the cooling control of a color proof producing device.
Figure 7:
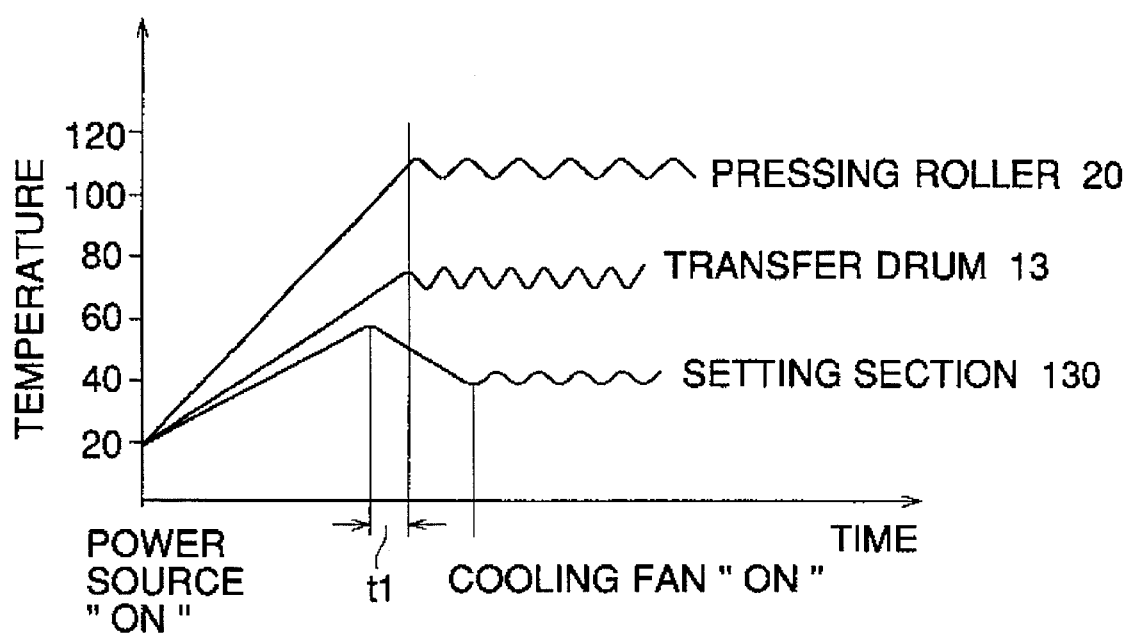
FIG. 7 is a drawing representing the timing of cooling control.

The following describes the cooling control for the color proof producing device 1 with reference to FIGS. 6 and 7. FIG. 6 is a drawing representing schematic configuration of the cooling control of a color proof producing device, while FIG. 7 is a drawing representing the timing of cooling control. As discussed above, the color proof producing device 1 has the image receiving material 4 carried by the transfer drum 13, with the image receiving material 4 placed opposite to the image forming material 2. Pressure and heat is given by the pressure roller 20 as a pressing means to transfer the image of the image forming material 2 onto the image receiving material 4. The color proof producing device 1 comprises (i) a cooling fan 200 as a means for cooling the setter 130 of the transfer drum 13 on which the image forming material 2 is set, (ii) a transfer temperature detecting means 201 to detect the transfer temperature of the transfer drum 13, (iii) a pressure/temperature detecting means 202 to detect the pressure/temperature of the pressure roller 20 which is a heating means, (iv) a set work detecting means 300 to detect the image forming material setting condition, and (v) a control means 203 to control the cooling fan 200, heater 18 and heater 21, based on the information of the transfer temperature detecting means 201, pressure/temperature detecting means 202 and set work detecting means 300.

The cooling fan 200 as a cooling means can be controlled by the control means 203, and it is possible to reduce impact on others by cooling the setter 130 of the transfer drum 13 whenever required, thereby facilitating recovery of temperature uniformity.

When temperature adjustment is started after power is turned on, the control means 203 provides control in such a way that the operation of the cooling fan 200 is suspended until transfer temperature or pressure temperature reaches a specified value.

Cooling air is fed by the cooling fan 200 from the cooling air nozzle 28 to the setter 130 of the transfer drum 13 to cool it. The transfer temperature detecting means 201 which detect the temperature of the transfer drum 13 is, for example, laid out in contact with the side of transfer drum 13 and send information on temperature of the transfer drum to the control means 203. The heater 18 is driven under the control of the control means 203 to ensure that the transfer drum 13 will have a temperature of 60 to 90 degrees Celsius. The pressure/temperature detecting means 202 which detects the pressure and temperature of the pressure roller 20 is, for example, laid out in contact with the surface of the pressure roller 20, and sends information on temperature to the control means 203. The heater 21 is driven by the control of the control means 203 which provides control to ensure that the temperature of the heater 21 will be 70 to 140 degrees Celsius.

Based on the temperature information from the transfer temperature detecting means 201 or the pressure/temperature detecting means 202, the control means 203 controls the cooling fan 200, as illustrated in FIG. 7. When the power is turned on, the heater 18 of the transfer drum 13 and the heater 21 of the pressure roller 20 are turned on. When a subsequent temperature adjustment is started, the operation of cooling fan 200 is suspended until the transfer temperature or pressure temperature reaches a specified temperature, for example, until the transfer temperature of the transfer drum 13, has risen close to 60 degrees Celsius, whereupon cooling of the setter 130 occurs. Temperature adjustment completes several minutes "t1" after the cooling fan 200 has started operation. Since temperature adjustment characteristics illustrated in FIG. 7 depends on adjustment of heater capacity, which of pressure member temperature and transfer drum temperature is first adjusted depends on selection of the parts.

As discussed above, when the temperature adjustment is started after the power is turned on, the operation of the cooling fan 200 is suspended until the pressure member temperature or transfer drum temperature reaches a specified temperature. The cooling fan 200 is operated when the temperature has reached the specified temperature, thereby ensuring uniform startup of temperature adjustment.

The set work detecting means 300 which detects the image forming material setting condition is composed of a reflective sensor laid out on the forward side of the cooling air nozzle 28. When user's hands or the image forming material 2 is sensed by the set work detecting means 300, the image forming material 2 set work detection signals are sent to the control means 203.

By detection of the image forming material 2 setting condition, this control means 203 suspends or reduce the output of the cooling fan 200. Control of suspension or reduction of said cooling fan 200 output is released on completion of this setting condition detection or after the lapse of a specified time.

When the user has stretched his hands to set the image forming material 2 around the setter 130 of the transfer drum 13 under the normal operation, the air volume of the cooling fan 200 is reduced by several percent, for example, in order to ensure that the image forming material 2 will not flutter. Since the image forming material 2 can be set normally in about 30 seconds, the original air volume can be regained, for example, in 60 to 120 seconds even during detection by the set work detecting means 300 to prevent temperature rise due to insufficient air volume of the setter 130. Needless to say, the original air volume can be regained after the image forming material 2 has been set.

As discussed above, the cooling fan 200 output is suspended or reduced by detection of the image forming material 2 setting conditions, and control of suspension or reduction of said cooling fan 200 output is released on completion of this setting condition detection or after the lapse of a specified time, thereby preventing the top end from fluttering when the image forming material 2 is set, resulting in great improvement in setting work efficiency.

Figure 8:
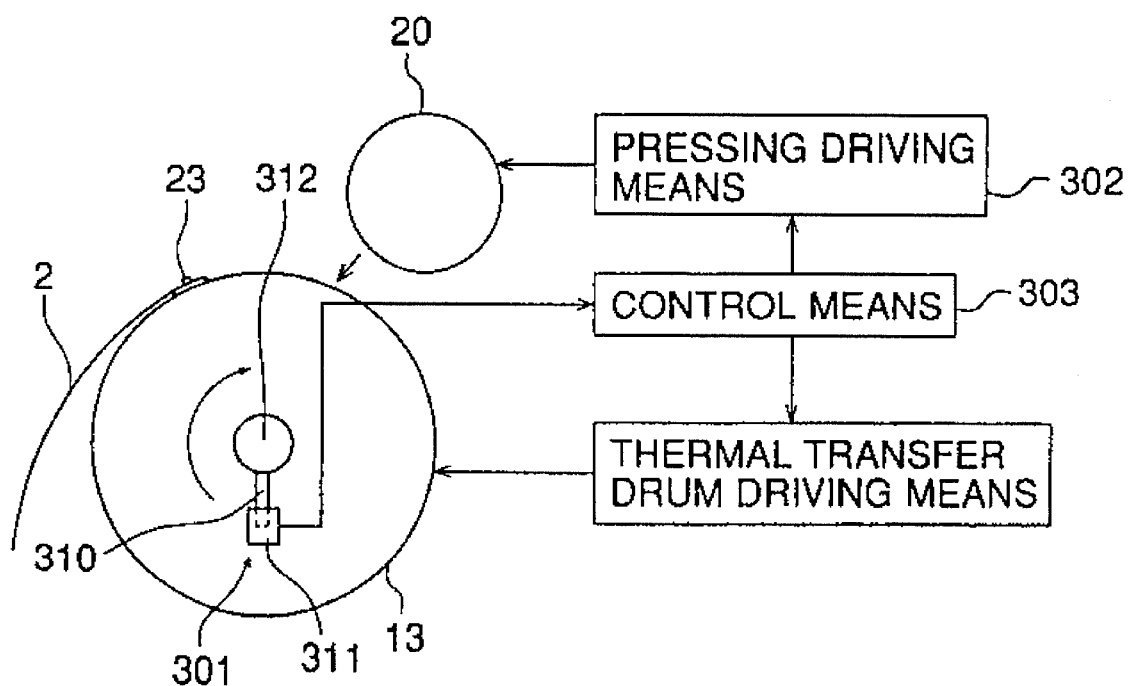
FIG. 8 is a drawing representing schematic configuration of the pressure control of a color proof producing device.
Figure 9:
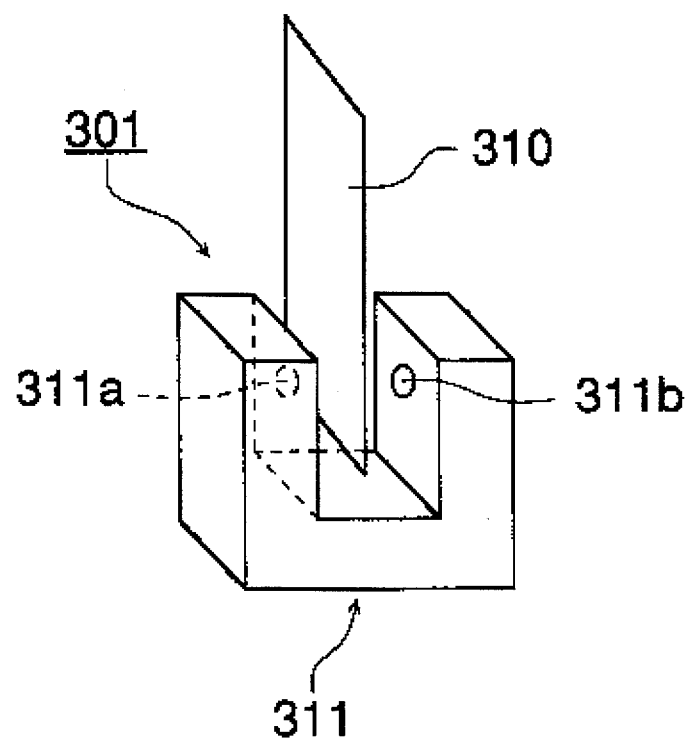
FIG. 9 is a drawing representing the configuration of a transfer drum position detecting means.
Figure 10:
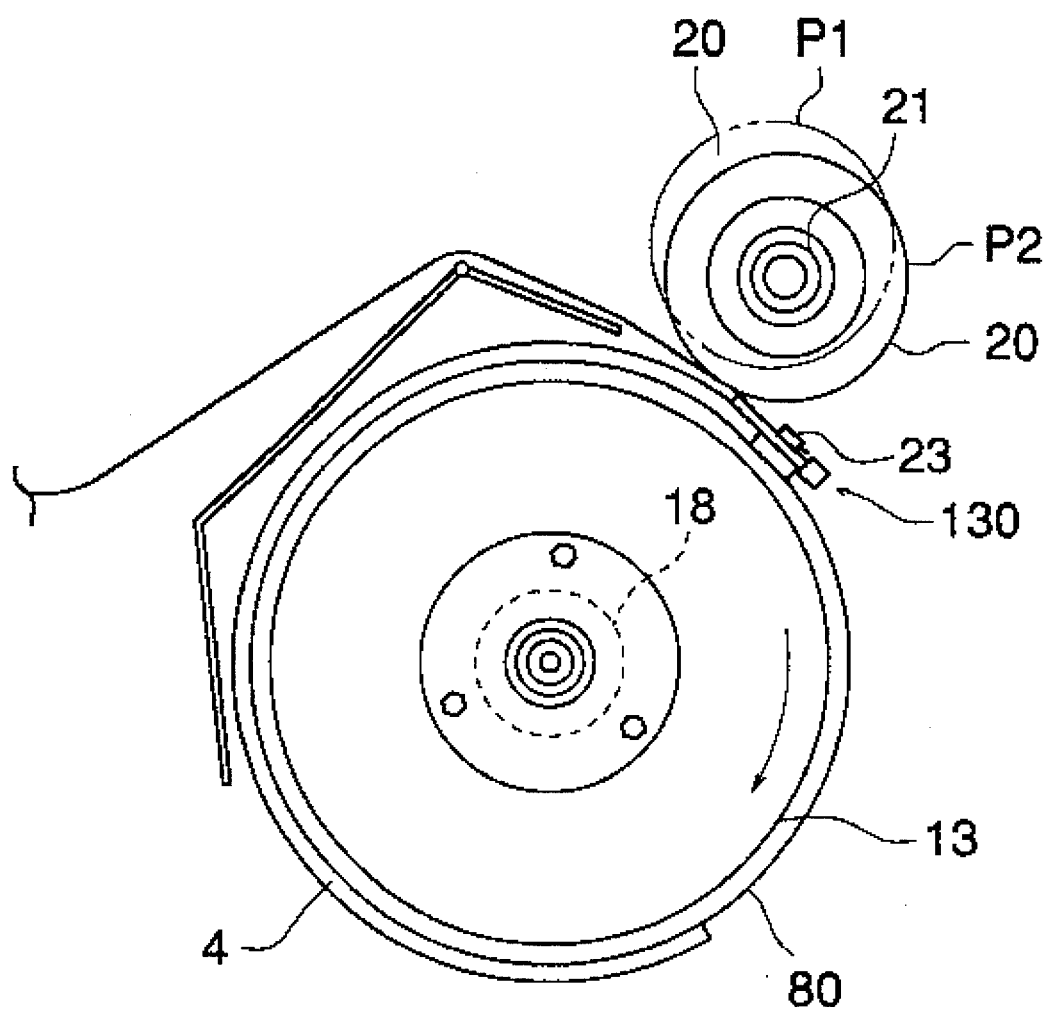
FIG. 10 is a drawing representing a pressure roller applying pressure.
Figure 11:
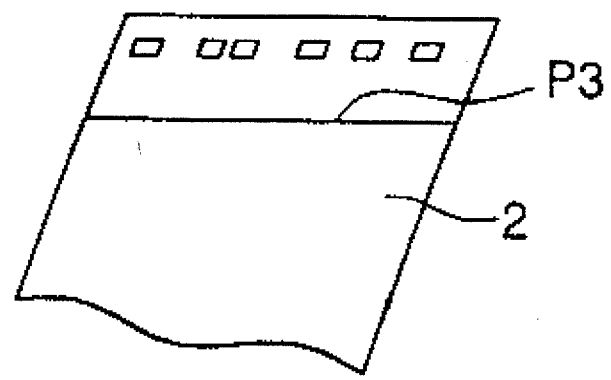
FIG. 11 is a drawing representing the effective area of the image.
Figure 11:
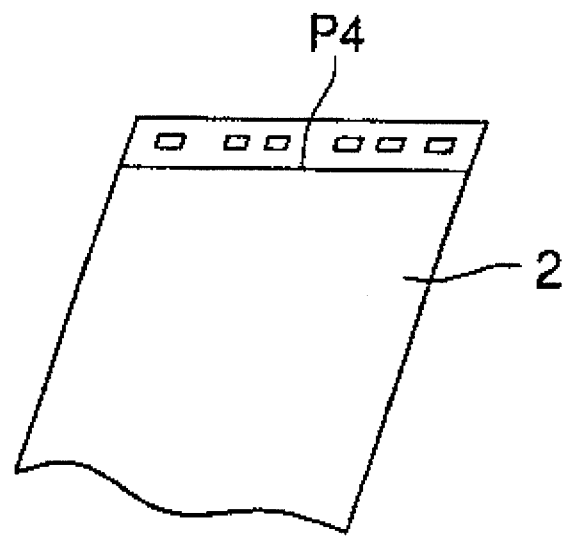

The following describes the pressure control of the color proof producing device 1 with reference to FIGS. 8 to 11. FIG. 8 is a drawing representing schematic configuration of the pressure control of a color proof producing device; FIG. 9 is a drawing representing the configuration of a transfer drum position detecting means; FIG. 10 is a drawing representing a pressure roller applying pressure; and FIG. 11 is a drawing representing the effective area of the image.

The color proof producing device 1 is provided with (i) a transfer drum drive means to drive the transfer drum 13, (ii) a transfer drum position detecting means 301 to detect the rotating position of the transfer drum 13, (iii) a pressure drive means 302 to press the pressure roller 20 as pressing means against the transfer drum 13, and (iv) a control means 303 to control the pressure drive means 302 by detection of the rotational position of the transfer drum 13. The portion of the transfer drum 13 is detected by the control means 303 to control the transfer drum drive means 300, thereby stopping the transfer drum 13 at the specified position; then it controls the pressure drive means 302 so that the image forming material 2 is pressed by the pressure roller 20 to drive the transfer drum 13 again, thereby executing a transfer process.

The transfer drum position detecting means 301 comprises a light interrupting plate 310 and a photo interrupter 311, as illustrated in FIGS. 8 and 9. The light interrupting plate 310 is laid out coaxial with the rotating shaft 312 of the transfer drum 13, thereby rotating with the transfer drum 13. The photo interrupter 311 is installed with the light emitting side element 311a opposed to the light receiving side element 311b. The light interrupting plate 310 is driven with rotation of the transfer drum 13. When it has come to the position of the photo interrupter 311, light emitted from the light emitting side element 311a is interrupted so that it does not reach the light receiving side element 311b. The position is determined by the presence or absence of the light reaching the light receiving side element 311b.

The following two methods are available to determine the positions of the pressure roller 20. In the first, a light interrupting plate 310 and a photo interrupter 311 are arranged to ensure that the light of the photo interrupter 311 will be interrupted at the transfer drum reference position. The light interrupting plate 310 and the photo interrupter 311 are arranged to permit detection of the transfer drum reference position for the user to set the image forming material 2. The pressing position of the pressure roller 20 is then determined by the rotational distance from the reference position. Alternatively, a pulse motor for driving the transfer drum 13 can be controlled in terms of the number of pulses when the transfer drum is driven.

The control means 303 causes the transfer drum 13 to be stopped at the specified position, and to be pressed by the pressure roller 20 as it has stopped; then the transfer drum 13 is turned to complete the transfer process. As illustrated in FIG. 10, the pressure position is shifted from the original pressure position P1 indicated by the two-dot chain line to the pressure position P2 shown by the solid line in the present embodiment, coming closer to the setter 130 of the transfer drum 13. As illustrated in FIG. 11(a), this causes the original pressure start position P3 to be shifted to the pressure position P4 shown by the solid line in the present embodiment, increasing by that amount the effective area of the image to be transferred.

Figure 12:
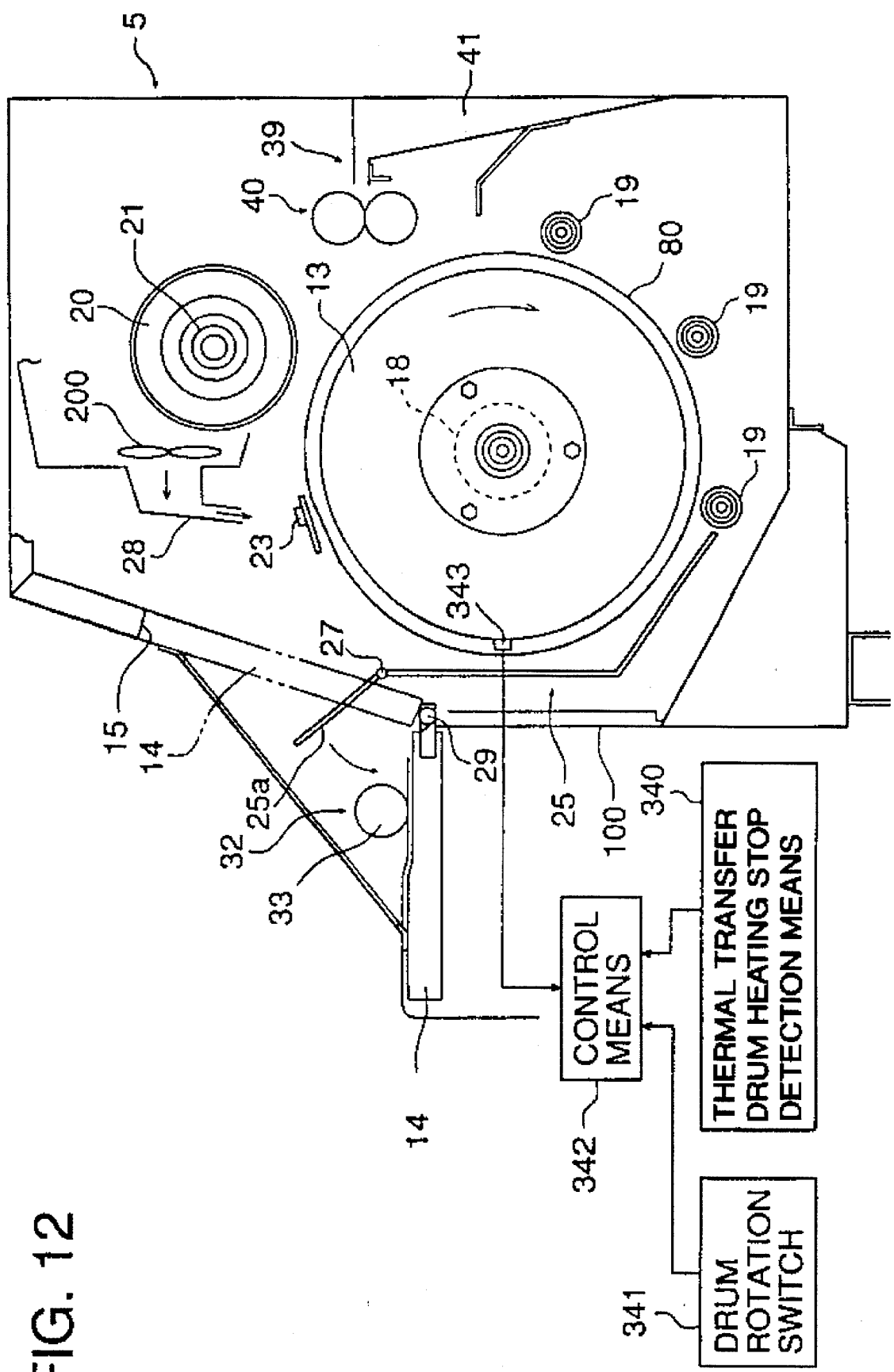
FIG. 12 is a drawing illustrating the schematic configuration of the cleaning control of a color proof producing device.

The following describes the cleaning control of the color proof producing device 1 with reference to FIG. 12, which is a drawing illustrating the schematic configuration of the cleaning control of a color proof producing device.

The color proof producing device 1 comprises (i) a transfer drum heating stop detecting means 340 to detect the stop of a heating means of the transfer drum 13, (ii) a drum rotation switch 341 to drive the transfer drum 13, and (iii) a control means 342 to drive the transfer drum 13 by the operation of the drum rotation switch 341 when heater 18 as a heating means is stopped. The control means 342 allows the transfer drum 13 to be driven only when the drum rotation switch 341 is being pressed.

As discussed above, the transfer drum is driven only when the drum rotation switch 341 is being pressed and the guide plane portion 25a is opened toward the outside, thereby allowing easy removal of the dust particles sticking to the adhesive sheet and ensuring improved maintenance.

The system can be provided with the transfer drum temperature detecting means 343 to detect the transfer drum temperature. It is possible to configure a design to ensure that the transfer drum is driven only when the drum rotation switch 341 is being pressed, when the temperature of the transfer drum 13 is kept below the specified value by the control means 342 or below 40 degrees Celsius for example. This prevents the user from cleaning the transfer drum 13 when temperature is high.

Figure 13:
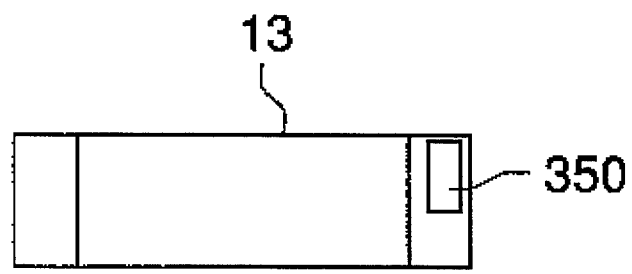
FIG. 13 is a plan illustrating the surface of a transfer drum provided with a member whose color is changed when transfer drum temperature has reached a specified value.

The surface of the transfer drum 13 can be provided with a member 350 whose color is changed when transfer drum 13 temperature has reached a specified value, as illustrated in FIG. 13. The member 350 whose color is changed when transfer drum 13 temperature has reached a specified value includes Thermolabel, Thermotape and Thermocreon manufactured and sold by Teika Sangyo and Rikagaku Kenkyojo. It is possible to select any of them whose color changes at 40, 50 and 60 degrees Celsius, for example.

The surface of the transfer drum 13 provided with a member 350 whose color is changed when transfer drum 13 temperature has reached a specified value permits the user to recognize by visual observation that the transfer drum has a high temperature, thereby preventing the user from cleaning the transfer drum when temperature is high.

The control means 342 provides control in such a way that, when the temperature of the transfer drum 13 is below the specified value, the separation guide 25 which separates the image forming material 2 laid out around the transfer drum 13 can be shifted in the direction away from the setter 130 of the transfer drum 13, and it can stop at a position close to the setter 130, when the transfer drum 13 temperature is reduced below a specified value.

As discussed above, when the temperature of the transfer drum 13 is below the specified value, the separation guide 25 which separates the image forming material 2 laid out around the transfer drum 13 can be shifted in the direction away from the setter 120 of the pressure point, allowing the user to shift the separation guide 25 for cleaning. When the temperature of the transfer drum 13 is increased above the specified value, the separation guide 25 is stopped at a position close to the setter 130, the separation guide 25 prevents the user from touching the surface of the transfer drum 13, thereby preventing the user from cleaning the transfer drum when temperature is high.

As stated above, according to the CONSTRUCTION (1), the cooling means can be controlled, and impact on others can be reduced by cooling the setter whenever required, thereby facilitating recovery of temperature uniformity.

According to the CONSTRUCTION (2), when the temperature adjustment is started after power is turned on, the operation of the cooling means is suspended until transfer temperature or the pressure temperature reaches a specified temperature. The cooling means is operated again when the temperature has reached the specified temperature, thereby ensuring uniform startup of temperature adjustment.

According to the CONSTRUCTION (3), the cooling fan output is suspended or reduced by detection of the image forming material setting conditions, and control of suspension or reduction of said cooling fan output is released on completion of this setting condition detection or after the lapse of a specified time, thereby preventing the top end from fluttering when the image forming material is set, resulting in great improvement in setting work efficiency.

According to the CONSTRUCTION (4), the transfer drum is stopped at the specified position, pressure is applied when it is stopped, and the transfer drum is driven to perform transfer work. This allows the pressurized position to be brought close to the setter, increasing by that amount the effective area of the image to be transferred.

According to the invention of CONSTRUCTION (5), the transfer drum is driven only when the drum rotation switch is being pressed, thereby allowing easy removal of the dust particles sticking to the adhesive sheet and ensuring improved maintenance.

According to the invention of CONSTRUCTION (6), if the transfer drum temperature has reduced below the specified value, the transfer drum is driven only when said drum rotation switch is being pressed. This is to prevent the user from cleaning the transfer drum when temperature is high.

According to the invention of CONSTRUCTION (7), the surface of the transfer drum is provided with a member whose color is changed when the transfer drum temperature has reached a specified value. This permits the user to recognize by visual observation that the transfer drum has a high temperature, thereby preventing the user from cleaning the transfer drum when temperature is high.

According to the invention of CONSTRUCTION (8), when the transfer drum temperature has reduced below the specified value, the separation guide to separate the image forming material laid out around the transfer drum can be moved in a direction of separating from the setter, allowing the user to clean the device by moving the separation guide. When the transfer drum temperature is over a specified value, the separation guide is stopped at a position close to said setter. This prevents the user from touching the surface of the transfer drum by the separation guide, thereby preventing the user from cleaning the transfer drum when temperature is high.

Figure 14:
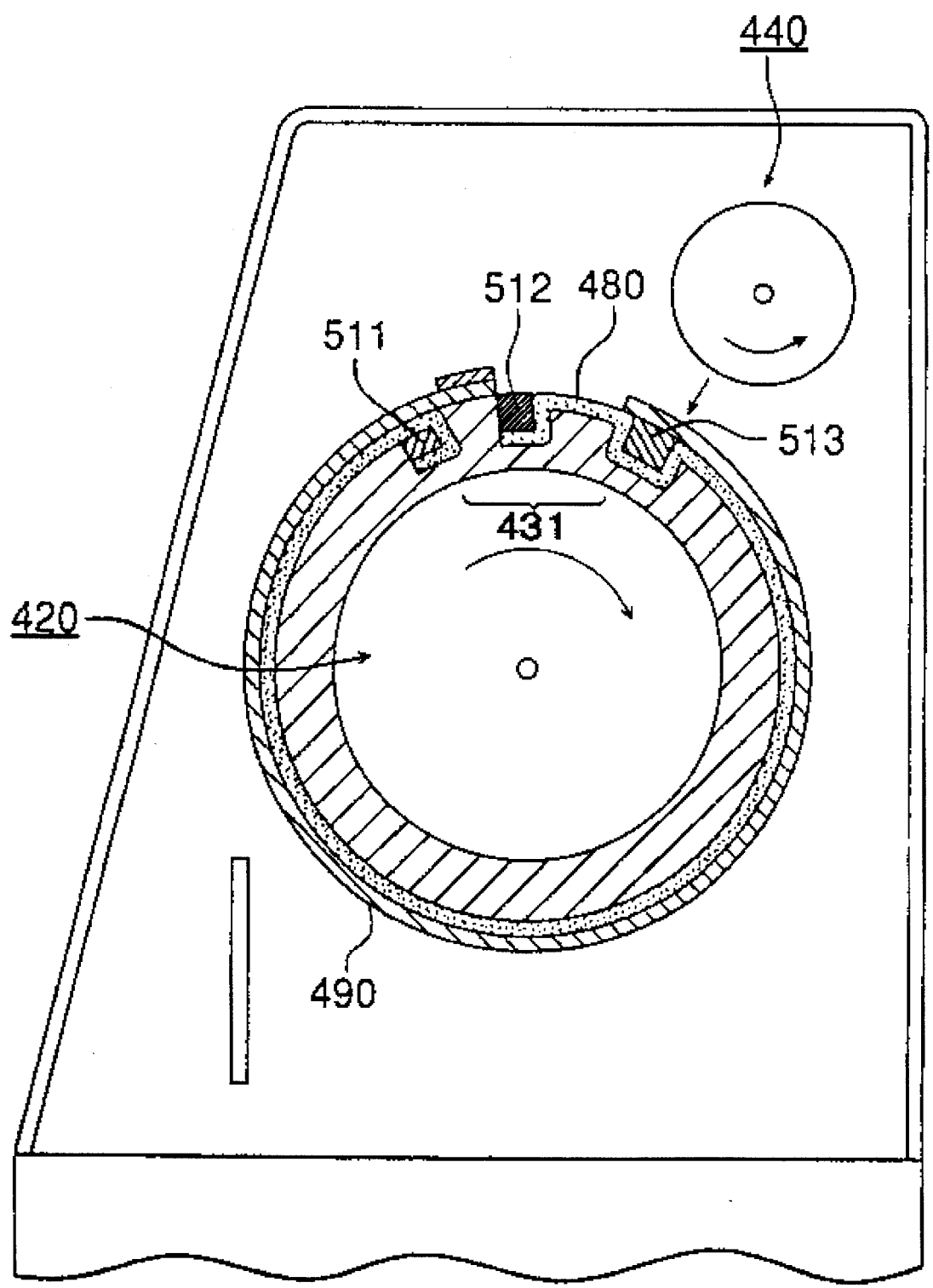
FIG. 14 is a drawing representing schematic configuration of an adhesive sheet covering the drum.

The following describes the embodiments with reference to CONSTRUCTIONS (9) to (16):

FIG. 14 is a drawing representing schematic configuration of an adhesive sheet covering the drum. To be more more specific, it shows a mechanism to secure the adhesives sheet to stabilize installation of the final printing paper. A retaining member 431 to retain the adhesive sheet 480 is located on the outer circumference of the pressure roller 420. The top end of the adhesive sheet is retained by a top end retaining member 511, while the rear end of the adhesive sheet is retained by the rear end retaining member 512. Furthermore, the sag removing member 513 serves to pull the adhesive sheet to remove sags. The drum means incorporates a lamp heater (not illustrated) as a heat source, and the temperature rises as high as 60 degrees Celsius or more, or even as high as 100 degrees Celsius or more due to heat transmission from the pressure roller, resulting in a heat insulating adhesive sheet being required. The drum surface is covered with a silicon adhesive sheet on which the final printing paper is set. This eliminates impact of thermal shrinkage of the final printing paper on register accuracy, facilitating installation of the final printing paper on the drum as well as its maintenance. It should be noted that the retaining member 431 must be formed to have the same level with the drum after it has been secured in position.

The concave portion of the drum to install the retaining member 431 must be provided on the portion which has nothing to do with image transfer. It is preferred to be of V-shaped, arc or rectangular type. Furthermore, the retaining member 431 is preferred to have the same width as the drum. At least one sag removing member 513 must be provided. The pressure means 440 is a pressure roller to press the transfer film.

Figure 15:
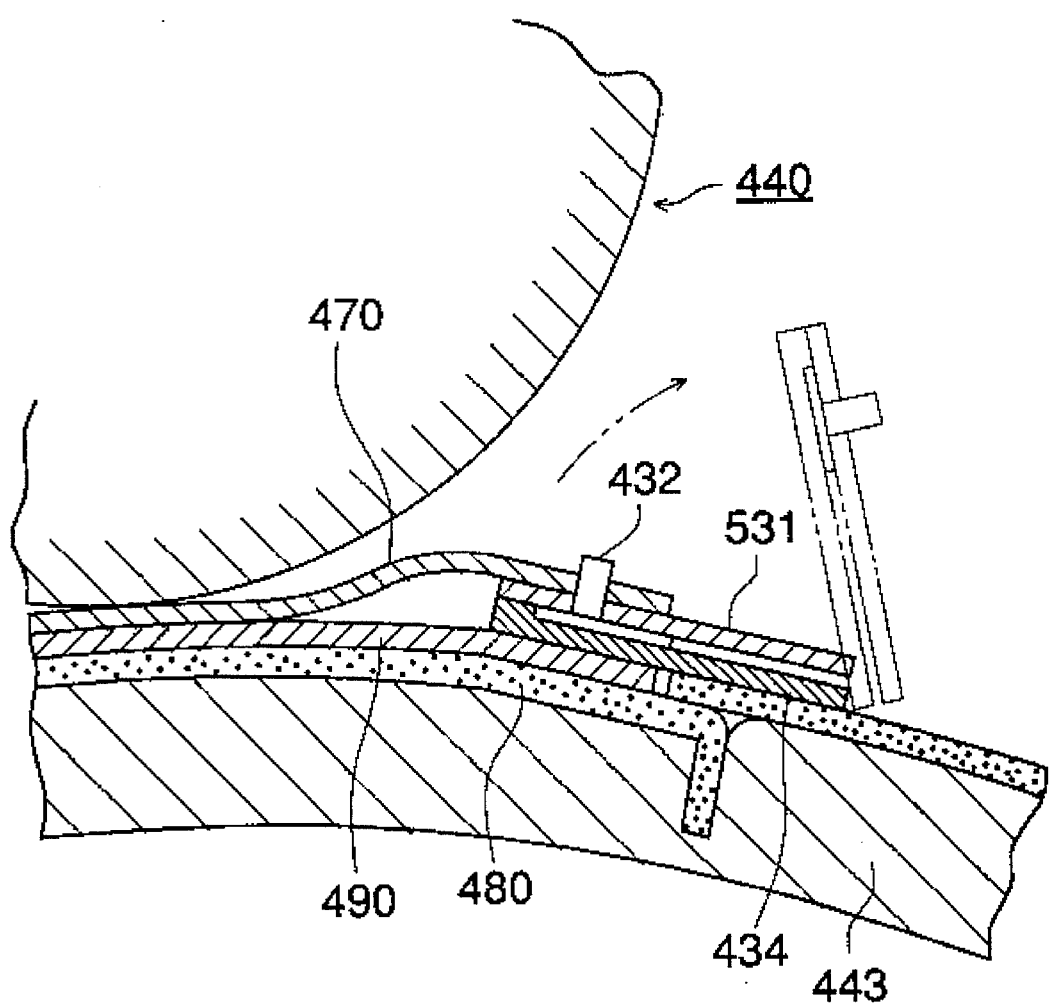
FIG. 15 is a drawing representing schematic configuration of a pin bar.

FIG. 15 is a drawing representing schematic configuration of a pin bar. The adhesive sheet 480 is located on the outer circumference of the drum 443, and final printing paper is set thereon. Furthermore, a retaining member 434, a pin bar member 432 and a separation member 531 are provided. Transfer film 470 is positioned by the pin bar member 432. The pressure means 440 is a means to transfer the transfer film onto the final printing paper.

Figure 16:
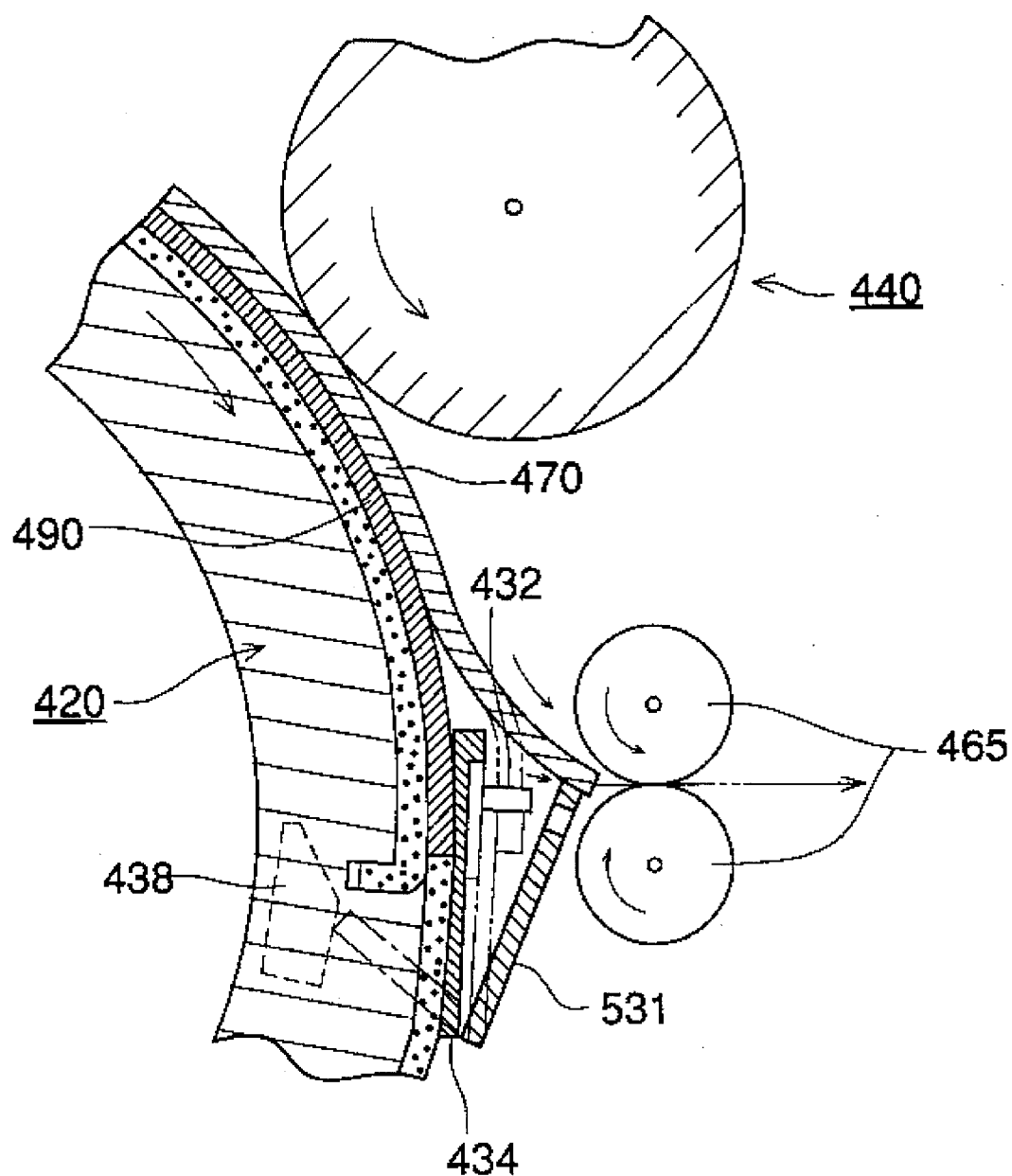
FIG. 16 is a drawing illustrating an automatic transfer film separation.

FIG. 16 is a drawing illustrating an automatic transfer film separation.

When the drum has rotated in the clockwise direction and the pin bar unit has passed by the pressure means 440, the transfer film 470 rises after the separation member 531 has passed by cam 438; then its top end is separated from the final printing paper 490 and is led to the roller 465. This causes the transfer film 470 having been transferred to be automatically separated from the final printing paper 490 to be discharged out of the system.

Figure 17:
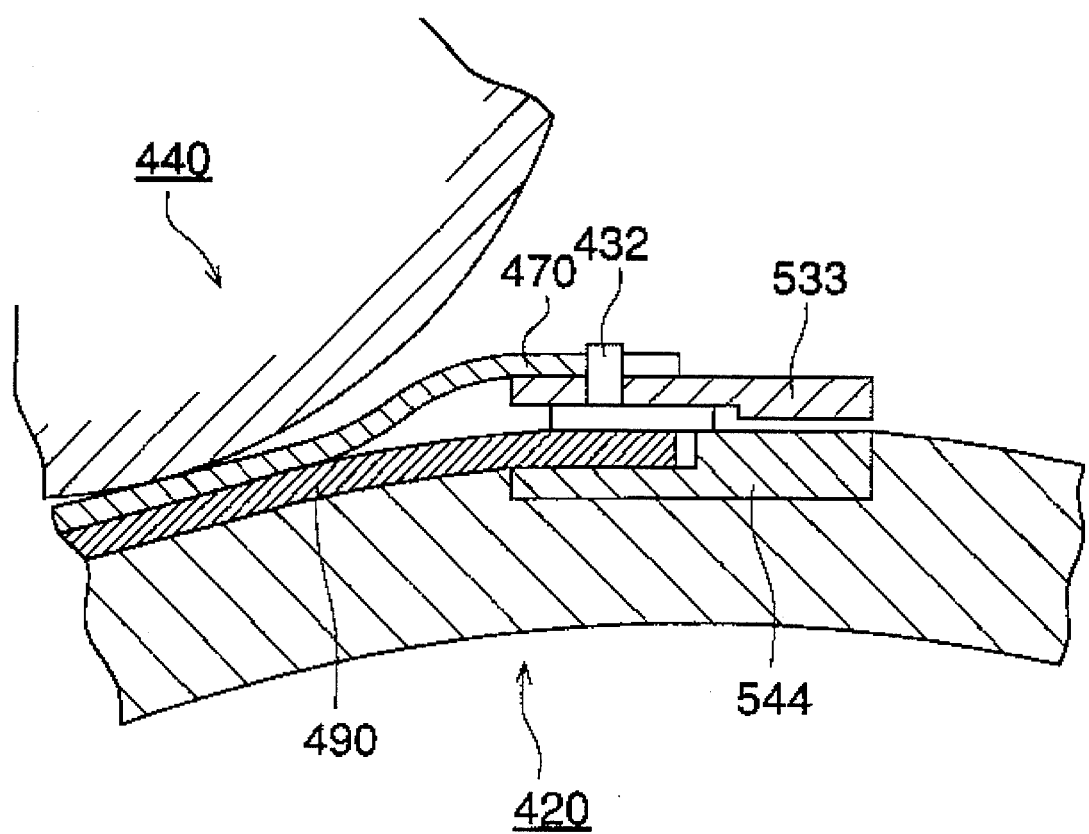
FIG. 17 is a drawing representing schematic configuration of the transfer film and final printing paper secured by a pin bar.

FIG. 17 is a drawing representing schematic configuration of the transfer film and final printing paper secured by a pin bar. A retaining member 544 is located on the outer circumference of a drum means 420, and final printing paper 490 is held between pin bar member 432 and retaining member 544. Furthermore, the transfer film 470 is positioned by the pin bar member 432. The transfer film is separated by a separation member 533 after transfer. The pressure roller means 440 places the transfer film 470 on top of the final printing paper 490 to provide pressure (to execute transfer process).

Figure 18:
FIGS. 18(a) to 18(c) are drawings illustrating the parts for avoiding burn accidents.
Figure 18:
Figure 18:
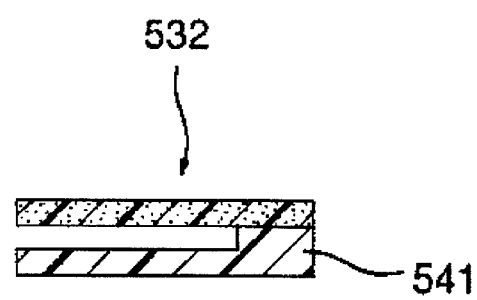

The following describes the drum type transfer device. This drum type transfer device is a variation of the device shown in FIG. 1. FIG. 18 shows only the differences from FIG. 1. The temperature inside the drum type transfer device is 60 to 80 degrees Celsius on the drum portion, and that of the pressure roller is 80 to 120 degrees Celsius. Means must be provided to avoid burns during operation.

FIG. 18 is drawing illustrating the parts for avoiding burn accidents. FIG. 18(a) represents the top end of a pin bar member 521 made of plastic parts used to avoid burns. FIG. 18(b) shows a pin bar member 522 made entirely of plastics. FIG. 18(c) represents a separation member 532 made of rubber as a heat insulator, and securing member 541 made of plastics as a heat insulator. All heat generating parts (not illustrated) which may be touched by hand during the operation are preferred to have some means for avoiding burns.

Figure 19:
FIGS. 19(a) and 19(b) are drawings illustrating a member to register final printing paper.
Figure 19:
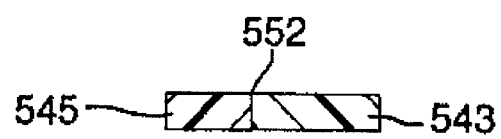

The following describes the drum type transfer device which facilitates registering when setting the final printing paper on the drum. This drum type transfer device is one of the variations of the device given in FIG. 1. FIG. 19 shows only the register portion. FIG. 19 is a drawing illustrating a member to register final printing paper. FIG. 19(a) shows the final printing paper securing member 542 made of a plastic member having a final printing paper register mark 551. FIG. 19(b) shows the securing members 543 and 545 of the insulating material comprising a combination of plastics having different colors which are provided with register marks 552. Register marks discussed above facilitate registering of the final printing paper.

Figure 20:
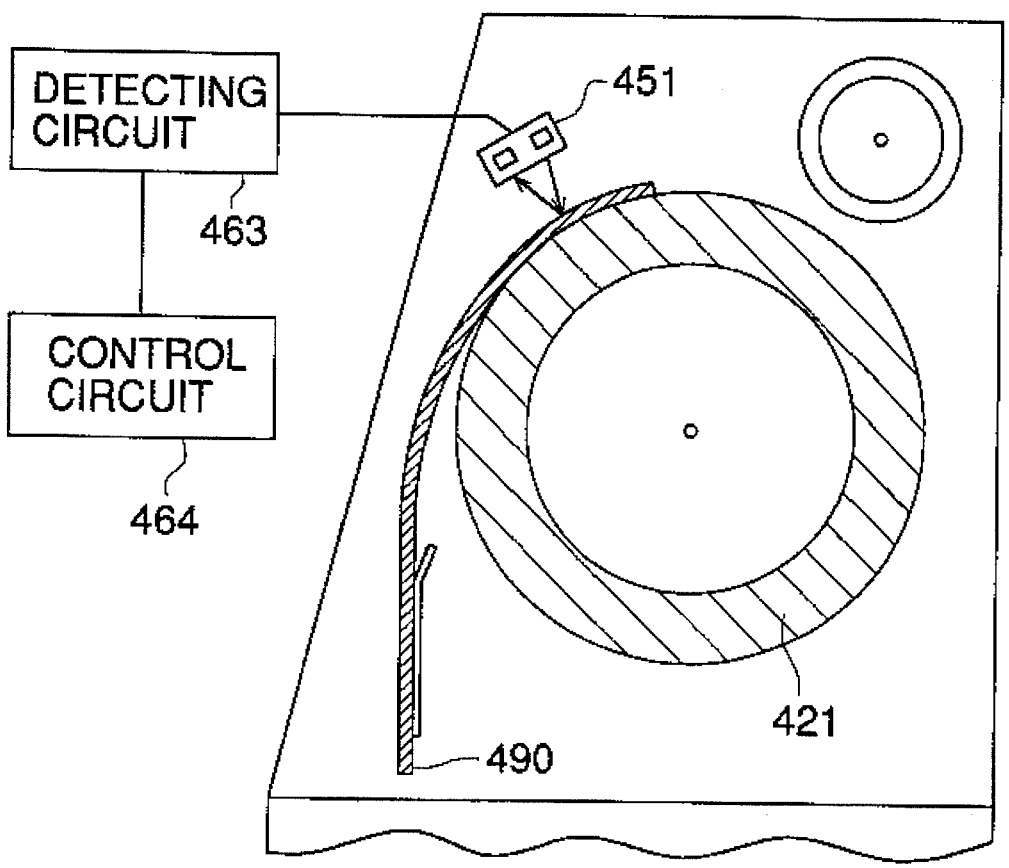
FIGS. 20(a) and 20(b) are drawings illustrating a mechanism of detecting the presence/absence and size of final printing paper.
Figure 20:
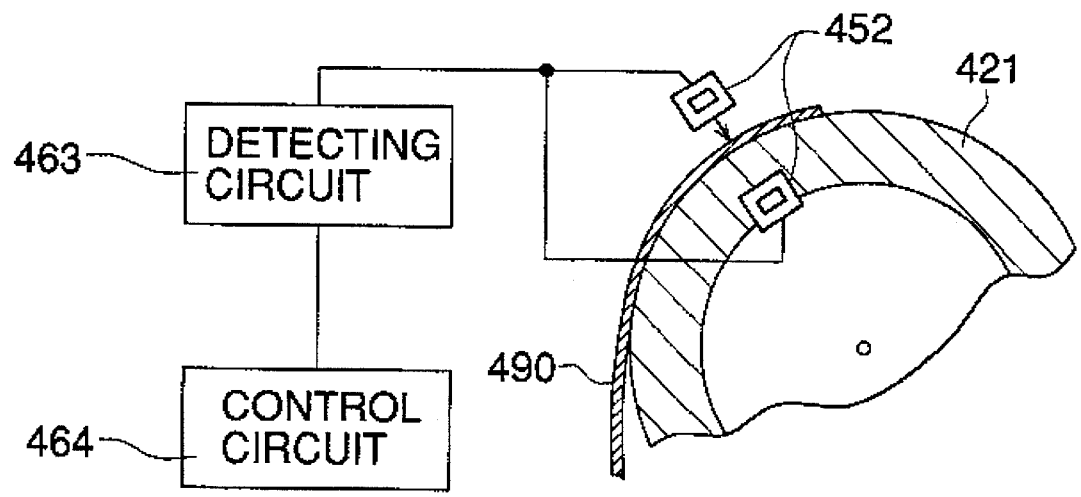

The following describes the drum type transfer device provided with operation error preventive measures. This drum type transfer device is one of the variations of the device shown in FIG. 1. FIG. 20 shows only the differences.

FIG. 20 is a drawing illustrating a mechanism of detecting the presence/absence and size of final printing paper. FIG. 20(a) represents shows the final printing paper 490 set on the drum 421, where the presence/absence and width of final printing paper is detected by the reflective type optical detecting means 451. Furthermore, the length is detected by drum rotation. Then the signal is amplified by the detecting circuit 463. Presence/absence and size of final printing paper are displayed through the control circuit 464. When there is a final printing paper setting error, alarm display is given. Furthermore, the reflective type optical detecting means 451 in FIG. 20(a) corresponds to a transmission type counterpart in FIG. 20(b). Detection of only the width or only the length of the final printing paper is also acceptable.

Figure 21:
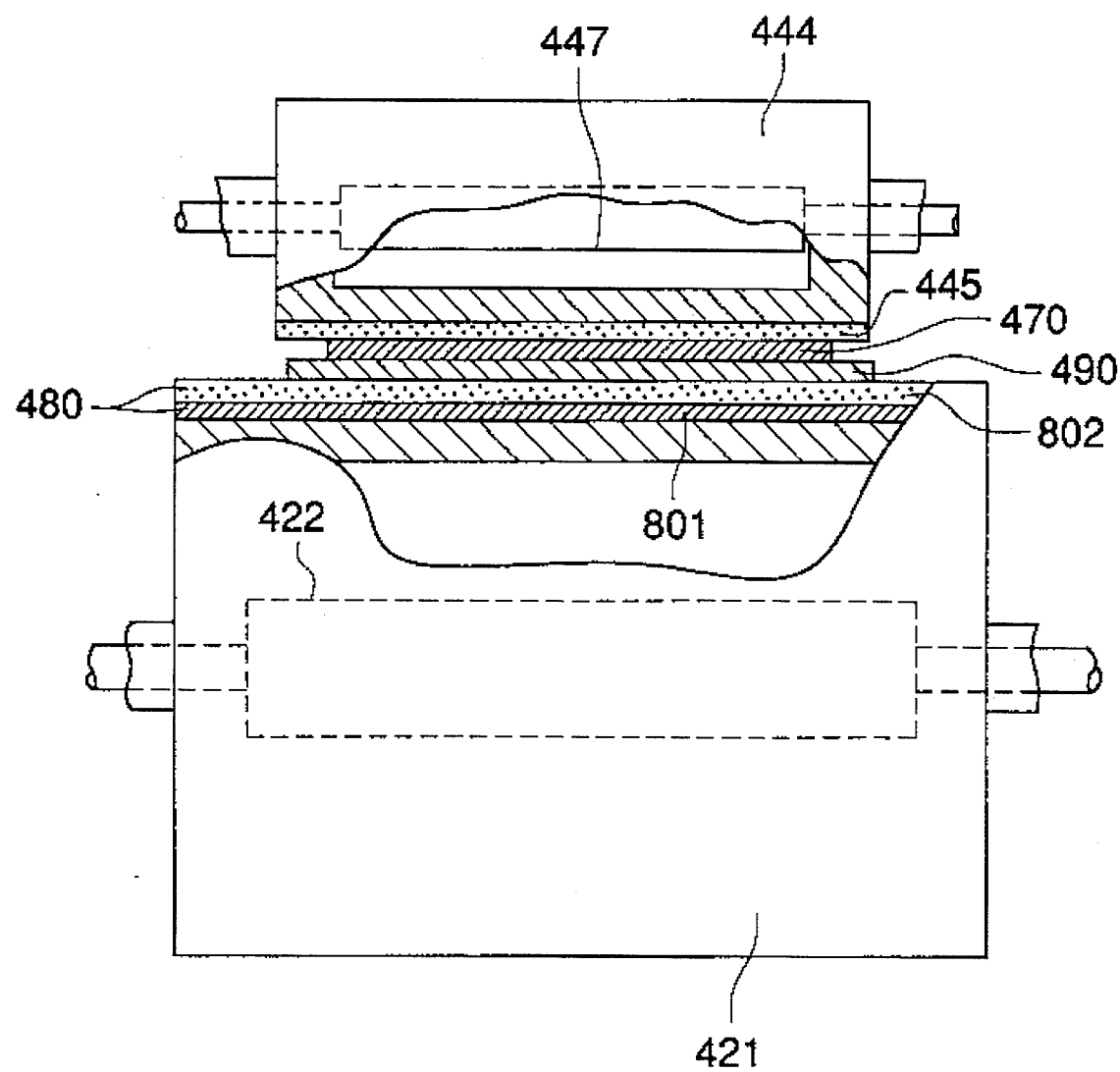
FIG. 21 is a front view, partly in cross section, of a transfer mechanism.

The following describes the drum type transfer device having a pressure mechanism which ensures uniform transfer. This drum type transfer device is one of the variations of the device shown in FIG. 1. FIG. 21 shows only the differences.

FIG. 21 is a front view, partly in cross section, of a transfer mechanism. A heater 422 is provided inside the drum 421, and adhesive sheet 480 is wound on the outer circumference. The outer surface of transfer drum 421 is comprised of: an adhesive sheet 480, a PET paste 801, and a silicon layer 802. The PET paste layer is preferably to have a thickness of 75 to 175 µm; and the silicon layer preferably has a Vicker's hardness of 30 to 80 degrees. The pressure roller means 444 incorporates a heater 447, and the elastic member 445 such as rubber is wound on the outside.

Furthermore, this drum type transfer device is designed to ensure that the pressure is the minimum at the central portion in the direction of the roller length, when the final printing paper 490 and the transfer film 470 are pressed between the drum unit and pressure roller.

Figure 22:
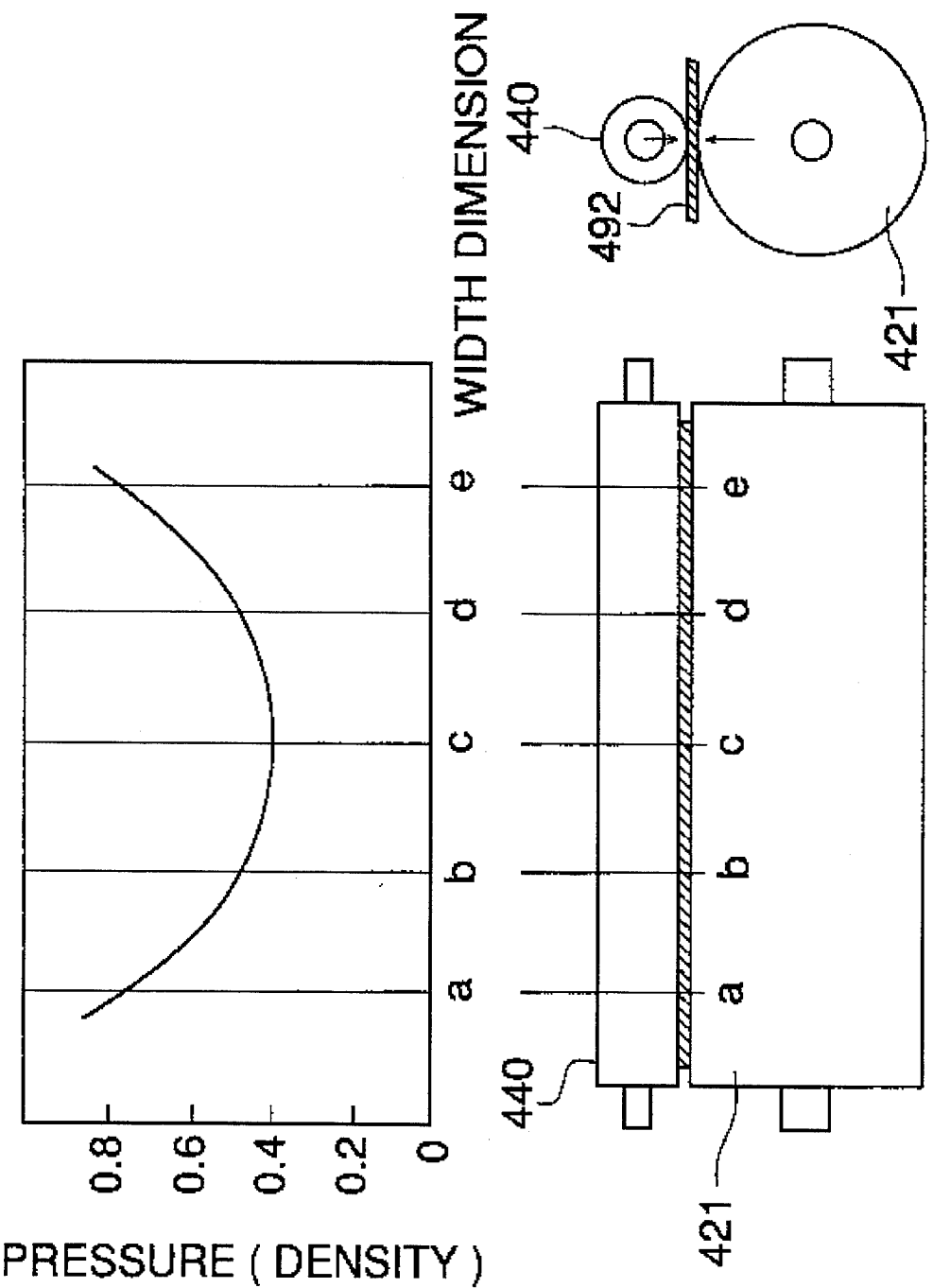
FIG. 22 is a drawing showing measuring procedure in a pressing means.

The following describes the pressure measuring procedure:

FIG. 22 is a drawing showing measuring procedure in a pressing means. Pressure measuring paper 492 for pressure sensitive paper is held between the drum 421 and pressure roller 440, and is pressed. Contrast of the pressure measuring paper 492 is used to check the pressure distribution from point a to point e. Measurements are shown in the same Figure. As illustrated, the minimum pressure is indicated at the central portion. Extra-low pressure paper FPD301 (Fuji Film Co., Ltd.) was used as pressure sensitive paper. Elastic member 45 may the minimum pressure distribution at the central portion even if there is no adhesive sheet.

Figure 23:
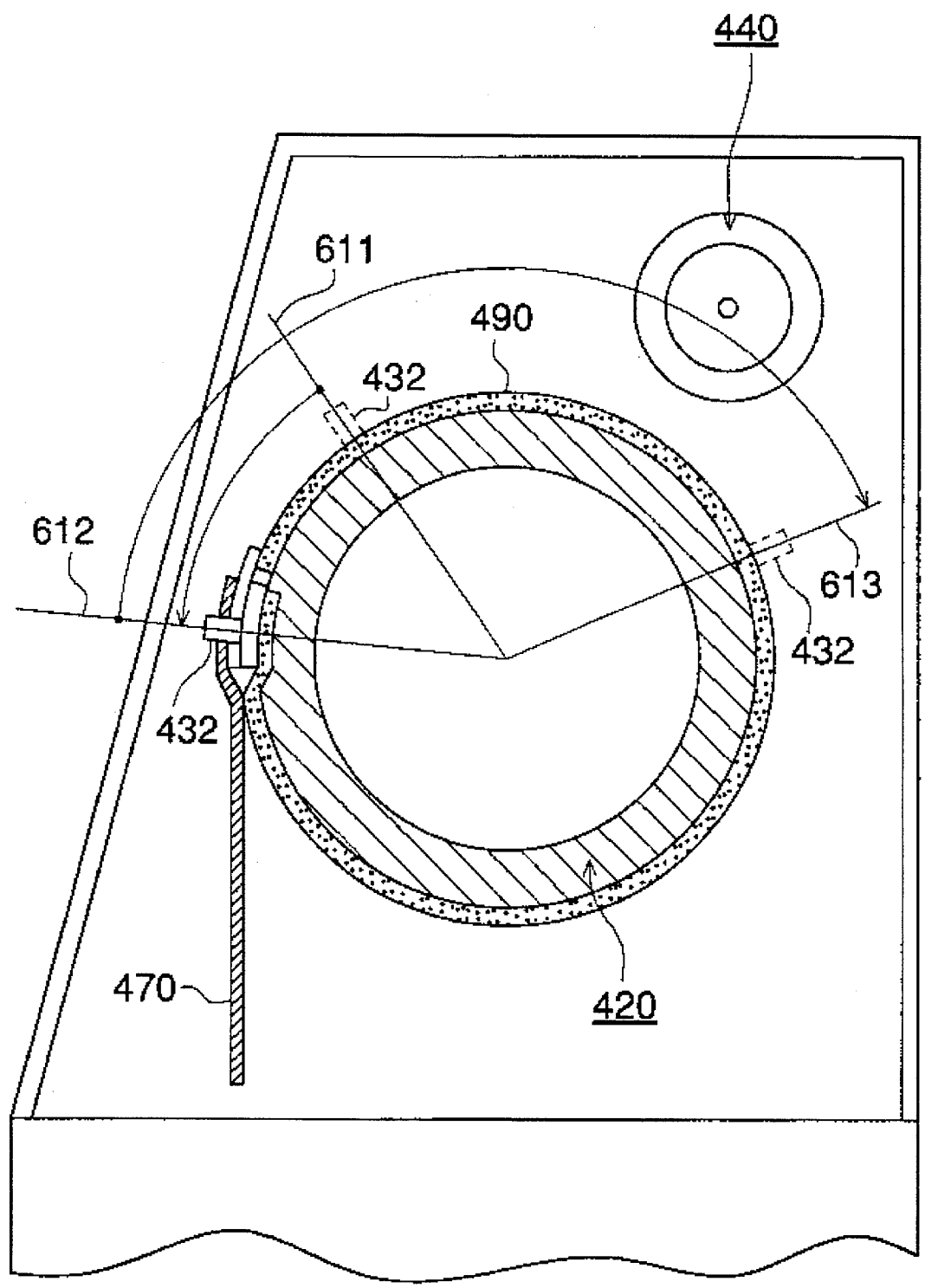
FIG. 23 is a drawing representing schematic configuration of a transfer unit of a drum type transfer device.

The following describes the drum type transfer device having a means for avoiding film partial separation and creases. This drum type transfer device is one of the variations of the device shown in FIG. 1. FIG. 23 shows only the differences.

FIG. 23 is a drawing representing schematic configuration of a transfer unit of a drum type transfer device. The transfer process will be described first: A drum means 420 is set at the first position 611, and the transfer film 470 is positioned and installed on the pin bar member 432. Then it is turned to the second position 612 to remove the partial separation or crease of the transfer film 470 by its own weight. After that, it is rotated in the clockwise direction, and at the third position 613, the drum is driven in the clockwise direction by the pressure roller 440, thereby executing transfer process. This ensures the transfer film to be pressed free from partial separation or crease.

Figure 24:
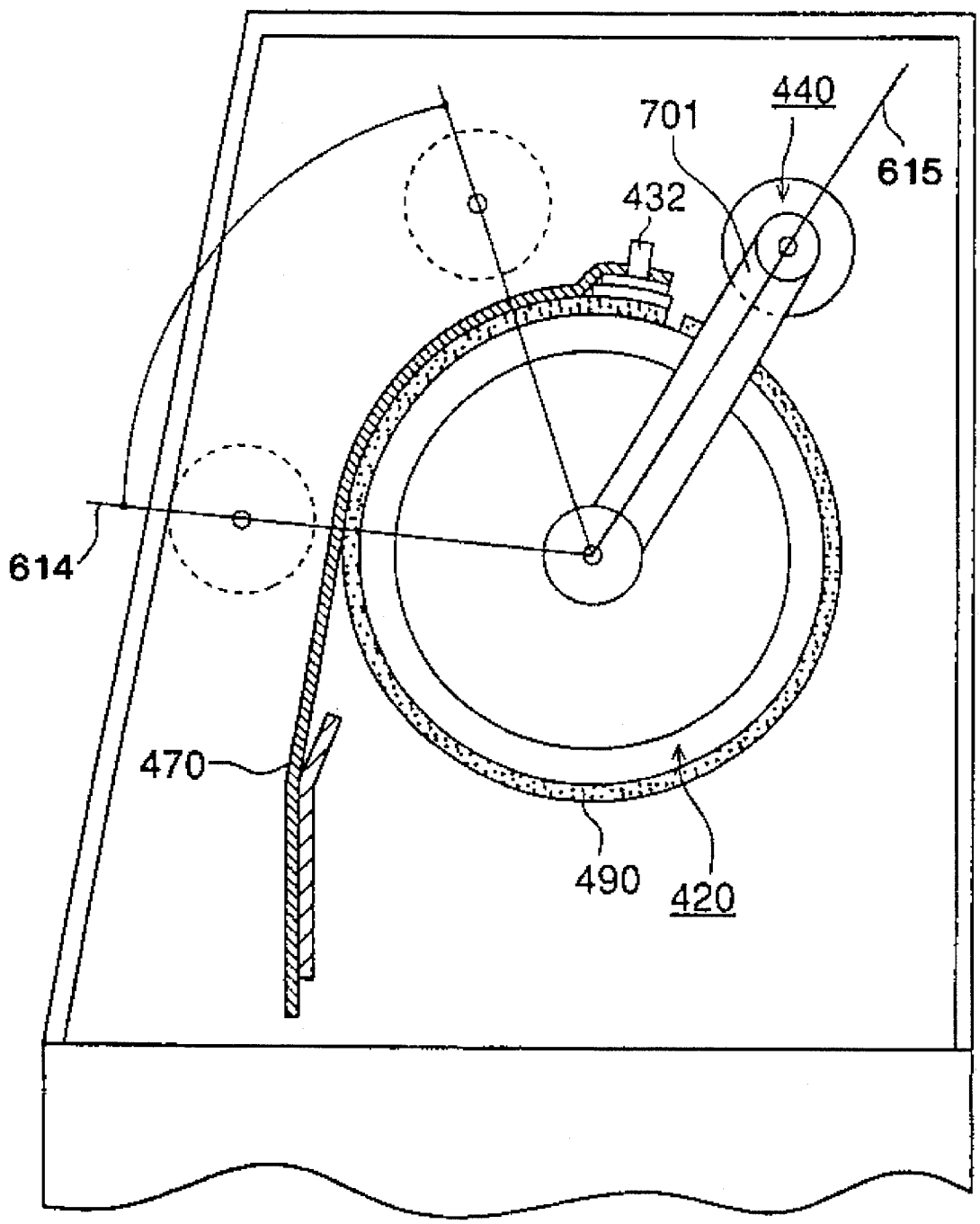
FIG. 24 is a drawing representing schematic configuration of a transfer unit of another drum type transfer device.

The following embodiment describes the drum type transfer device having a means for avoiding film partial separation and creases. This drum type transfer device is one of the variations of the device shown in FIG. 1. FIG. 24 shows only the differences.

FIG. 24 is a drawing representing schematic configuration of a transfer unit of another drum type transfer device. The transfer film 470 is set on the outer circumference of the drum means 420 at the first position 614, thereby removing the partial separation or crease of the transfer film 470 by its own weight. After that, the pressure roller rotary unit 701 which rotates in the direction of the outer circumference of the drum is rotated in the clockwise direction, until it comes to the second position 615. Then the transfer film is pressed, thereby executing transfer process. This ensures the transfer film to be pressed free from partial separation or crease.

Figure 25:
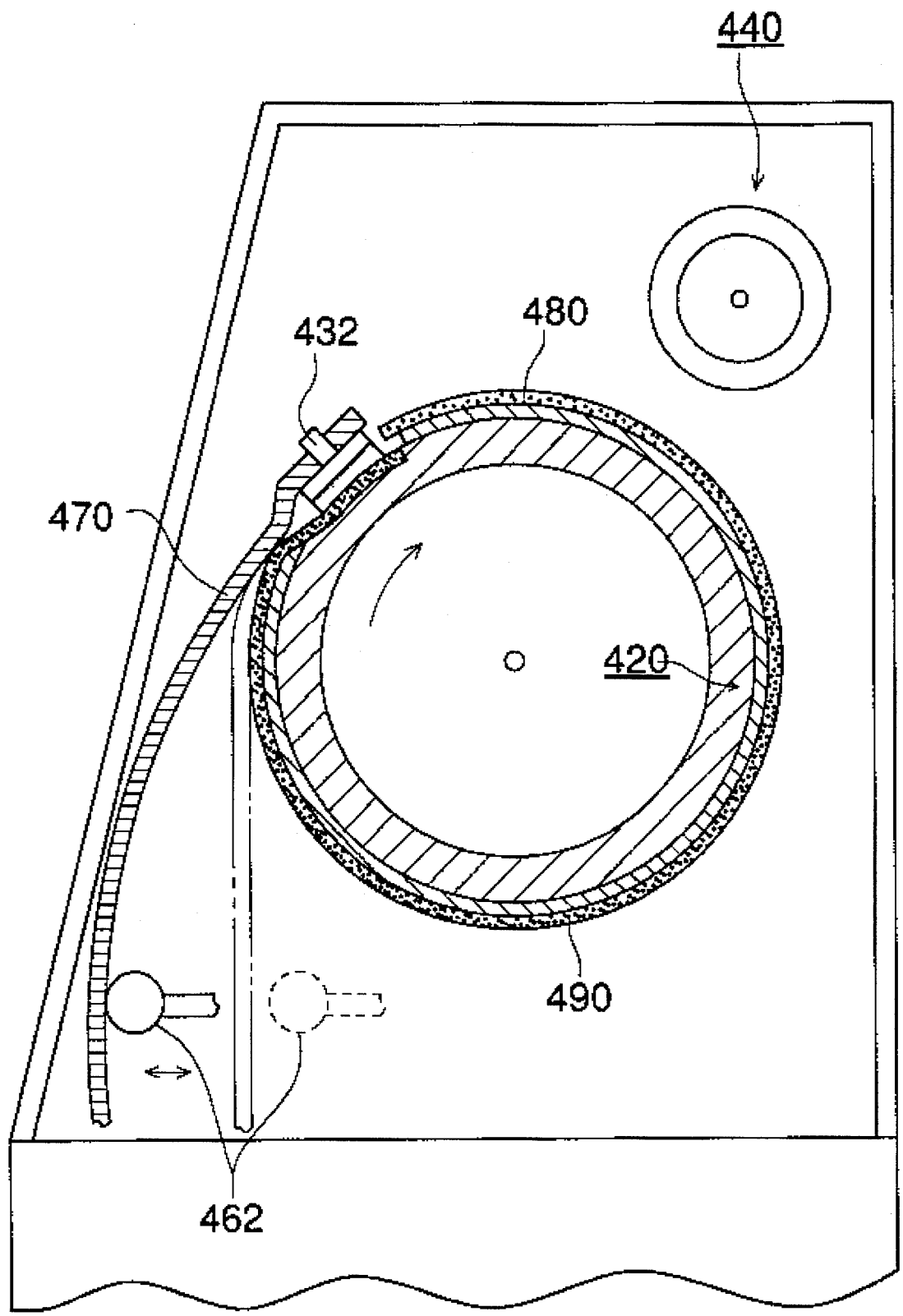
FIG. 25 is a drawing representing schematic configuration of a transfer unit of still another drum type transfer device.

The following describes the drum type transfer device having a means for avoiding film partial separation and creases when the transfer film is installed on the drum. This drum type transfer device is one of variations of the device shown in FIG. 1. FIG. 25 shows only the differences.

FIG. 25 is a drawing representing schematic configuration of a transfer unit of still another drum type transfer device. The transfer process will be described first: The transfer film 470 is positioned on the pin bar member 432 provided on the drum means 420 and is set thereto. Then the deflection prevention roller 462 is shifted from the position of the solid line in Figure to that of the dotted line to remove the partial separation of the transfer film 470, with its part wound on the drum. After rotation in the clockwise direction, the transfer film is pressed by the pressure roller means 440, to drive the drum in the clockwise direction, thereby executing transfer process. The deflection prevention roller 462 is operated synchronous with the drum rotation to prevent thermal transfer due to contact between transfer film and the drum before being pressed. Furthermore, this results in reduction in contact resistance during the transfer film transport, making a significant contribution to quality improvement.

Figure 26:
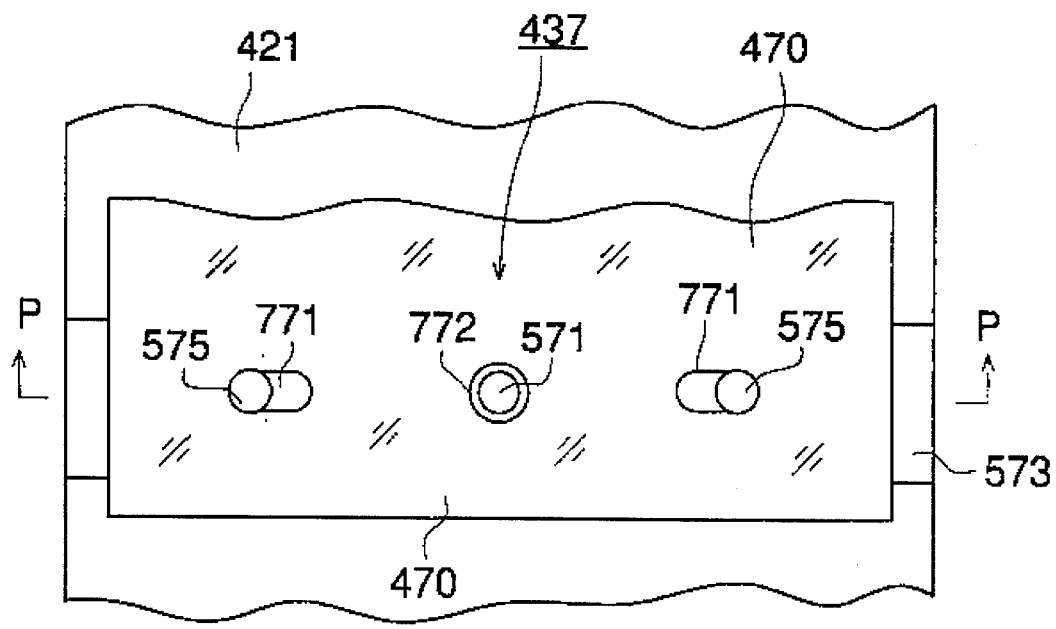
FIGS. 26(a) and 26(b) are drawings representing schematic configuration of a transfer unit of a further drum type transfer device.
Figure 26:
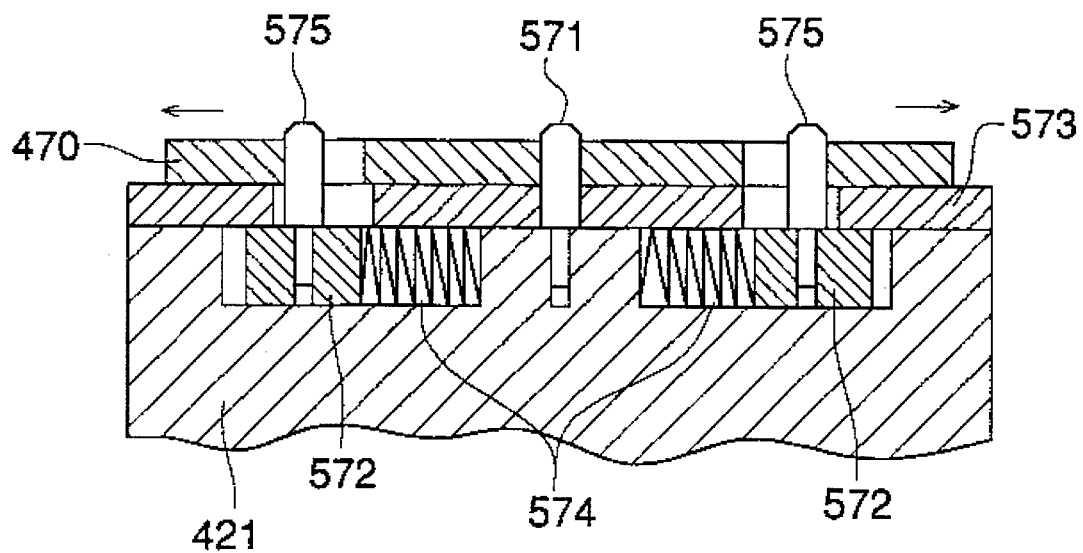

The following embodiment describes the drum type transfer device having a means for avoiding film partial separation and creases. This drum type transfer device is one of variations of the device shown in FIG. 1. FIG. 26 shows only the differences.

FIG. 26 is a drawing representing schematic configuration of a transfer unit of a further drum type transfer device. To be more specific, it has a mechanism to pull the transfer film 470 crosswise (in the direction of width) to remove partial separation and crease, thereby executing transfer process. FIG. 26(a) is a plan showing the major portion, while FIG. 26(b) is a cross sectional view taken along the P—P. The transfer film 470 is provided with two positioning long holes and one hole. The hole 772 of the transfer film 470 is engaged with the pin 571 of the movable pin means 437, and the long hole 771 is engaged with pin 575 energized in the direction of both widths of the transfer sheet. The pin 575 is energized by the spring 574 mounted on the slide plate 572, and the retainer plate 573 makes the slide plate 572 slidable. This mechanism causes the transfer film to be stretched crosswise (in the direction of width) and removes free of sag or crease, thereby ensuring effective transfer operation.

Incidentally, in the above embodiments in which the sag removing means is operated so as to remove sags and crease as shown in FIGS. 23 through 26B, it is preferable to stop or reduce the cooling output of the cooling fan 200 in FIG. 2 while the sag removing means is being operated. Because, the flattering of the transfer film (the image forming material) can be avoided by the stop or the reduction of the cooling output.

The present invention featuring the configuration illustrated above provides the following effects: Construction 1 eliminates uneven transfer and provides upgraded picture quality. Features according to Constructions 2 to 4 serve to protect against burn accidents, ensuring safety improvement. Constructions 5 and 6 prevent operation errors, while Constructions 7 to 10 prevent uneven transfer, ensuring upgraded picture quality. Furthermore, Constructions 11 to 14 eliminate transfer displacement and unevenness, providing upgraded picture quality as well as improved workability.

What is claimed is:

1. An image forming apparatus, comprising:
   a transfer drum having a setting section at which an image receiving material is set on the transfer drum and an image forming material bearing an image is superimposed on the image receiving material;
   pressing means for pressing the image forming material with heat onto the image receiving material so that the image is transferred from the image forming material to the image receiving material; and
   cooling means for cooling the setting section of the transfer drum.

2. The image forming apparatus of claim 1, further comprising a transfer temperature detecting means to detect the temperature of the transfer drum, a pressing temperature detecting means to detect the temperature of the pressing means, and a control means to control the cooling means based on the temperature detected by the transfer temperature detecting means and the pressing temperature detecting means in such a manner that, when the temperature control is started after power is turned on, the control means stops the cooling operation of the cooling means until the transfer temperature and pressing temperature reach a predetermined temperature, and starts the cooling operation of the cooling means when the predetermined temperature has been reached.

3. The image forming apparatus of claim 1, further comprising an operation detecting means to detect a setting operation to set the image forming material, and a control means to control the cooling means based on the setting operation detected by the operation detecting means.

4. The image forming apparatus of claim 3, wherein when a setting operation is detected by the operation detecting means, the control means stops the cooling operation of the cooling means, and starts the cooling operation of the cooling means a predetermined time after the stopping or when no setting operation is detected.

5. The image forming apparatus of claim 3, wherein when a setting operation is detected by the operation detecting means, the control means reduces the cooling output of the cooling means, and increases the cooling output of the cooling means a predetermined time after the stopping or when no setting operation is detected.

6. The image forming apparatus of claim 1, further comprising sag removing means for removing a sag on the image forming material and control means to control the cooling means when the sag removing means is operating to remove the sag of the image receiving material.

7. The image forming apparatus of claim 6, wherein the sag removing means shifts the image receiving material to a position on which the image forming material is provided with a tension caused by its gravity so that the sag on the image receiving member is removed.

8. The image forming apparatus of claim 1, further comprising a transfer drum drive means for rotating the transfer drum; a drum position detecting means for detecting the rotational position of the transfer drum; a pressure drive means to press the pressing means against the transfer drum; and a control means for controlling the pressure drive means by detecting the rotational position of the transfer drum.

9. The image forming apparatus of claim 8, wherein the control means controls in such a way that the transfer drum drive means stops the transfer drum at a specified position in accordance with the detected rotational position of the transfer drum, then the pressure drive means drives the pressing means so as to press the transfer drum, and the transfer drum is rotated by the transfer drum drive means so that a transfer process is conducted.

10. The image forming apparatus of claim 1, further comprising a transfer drum heating stop detecting means to detect stopping of the heating means of the transfer drum; a drum rotation switch to drive the transfer drum; and a control means to drive the transfer drum by the operation of the drum rotation switch on the condition the heating means is stopped.

11. The image forming apparatus of claim 10, wherein, when the transfer drum temperature is lower than a specified value, the control means controls in such a way that the transfer drum is driven only when the drum rotation switch is being pressed.

12. The image forming apparatus of claim 11, wherein the surface of the transfer drum is provided with a member whose color is changed when the transfer drum temperature has reached a specified value.

13. The image forming apparatus of claim 10, further comprising a drum temperature detecting means to detect the transfer drum temperature wherein when the transfer drum temperature is lower than a specified value, the control means provides controls in such a way that a separation guide to separate the image forming material placed around the transfer drum is moved in a direction in which the separating guide is moved away from the setting section, and when the transfer drum temperature is higher than the specified value, the separating guide is stopped in close proximity to the setting section.

14. The image forming apparatus of claim 1, wherein the transfer drum comprises an adhesive sheet with which the transfer drum is covered, a top end securing means for securing the top end of the adhesive sheet to the drum, a rear end securing means for securing the rear end of the adhesive sheet to the drum, and a sag removing means to remove sags at the top and rears end of the adhesive sheet to the drum.

15. The image forming apparatus of claim 1, wherein the transfer drum comprises a sheet securing means for securing the image receiving material and the image forming material, the securing means includes an insulating material at least on a part of its surface.

16. The image forming apparatus of claim 15, wherein the sheet securing means is a pin bar member to position the top end of the image forming material.

17. The image forming apparatus of claim 15, wherein the sheet securing means is a separating member to separate the image forming material.

18. The image forming apparatus of claim 15, wherein the sheet securing means includes a positioning section to register the position of the image receiving material.

19. The image forming apparatus of claim 1, further comprising an optical detecting means to provide optical detection of presence/absence of the image receiving member or at least the longitudinal length of the image receiving material.

20. The image forming apparatus of claim 19, wherein the optical detecting means has a light emitting portion and light receiving portion to provide transparent and/or reflective type optical detection.

21. The image forming apparatus of claim 1, wherein the pressing means includes a pressure roller to give pressure in such a manner that the central portion of the pressure roller with respect to its longitudinal direction have the minimum pressure.

22. The image forming apparatus of claim 21, wherein the pressure roller includes an elastic member having a Vickers hardness of 30 to 89 degrees.

23. The image forming apparatus of claim 1, wherein the transfer drum comprises a heat source.

24. The image forming apparatus of claim 1, wherein the transfer drum comprises an adhesive sheet including a base made of PET whose thickness is 75 µm to 175 µm and a silicone layer whose thickness is 30 µm to 80 µm.

25. The image forming apparatus of claim 1, wherein the image forming material is set at the first position, is provided with tension at the second position by its gravity, and is applied with pressure at the third position.

26. The image forming apparatus of claim 1, further comprising a pressure roller drive means to move the pressure roller along the outer periphery of the drum.

27. The image forming apparatus of claim 1, further comprising a lifting means to lift the image forming material on a position in close proximity of the transfer drum.

28. The image forming apparatus of claim 1, further comprising a pin member to give tension in the direction of width to the image forming material, the pin member slidable on the drum; and an elastic member to energize the pin member in parallel to a shaft of the transfer drum.

* * * * *